US011714393B2

(12) United States Patent
Burroughs et al.

(10) Patent No.: US 11,714,393 B2
(45) Date of Patent: Aug. 1, 2023

(54) BUILDING CONTROL SYSTEM WITH LOAD CURTAILMENT OPTIMIZATION

(71) Applicant: Johnson Controls Tyco IP Holdings LLP, Milwaukee, WI (US)

(72) Inventors: John H. Burroughs, Wauwatosa, WI (US); Andrew J. Przybylski, Franksville, WI (US); Michael J. Wenzel, Grafton, WI (US); Mohammad N. Elbsat, Milwaukee, WI (US); Joseph C. Jones, Milwaukee, WI (US); Kirk H. Drees, Cedarburg, WI (US)

(73) Assignee: Johnson Controls Tyco IP Holdings LLP, Milwaukee, WI (US)

(*) Notice: Subject to any disclaimer, the term of this patent is extended or adjusted under 35 U.S.C. 154(b) by 0 days.

(21) Appl. No.: 17/576,615

(22) Filed: Jan. 14, 2022

(65) Prior Publication Data
US 2022/0137580 A1 May 5, 2022

Related U.S. Application Data

(63) Continuation-in-part of application No. 17/483,078, filed on Sep. 23, 2021, which is a continuation-in-part
(Continued)

(51) Int. Cl.
*G05B 19/042* (2006.01)
*G05B 15/02* (2006.01)
(Continued)

(52) U.S. Cl.
CPC .............. *G05B 19/042* (2013.01); *F24F 8/10* (2021.01); *F24F 11/47* (2018.01); *F24F 11/52* (2018.01);
(Continued)

(58) Field of Classification Search
CPC ...... G05B 19/042; G05B 15/02; G05B 19/04; G05B 2219/2614; F24F 8/10; F24F 11/47;
(Continued)

(56) References Cited

U.S. PATENT DOCUMENTS 5,209,398 A 5/1993 Drees
5,497,452 A 3/1996 Shimizu et al.
(Continued)

FOREIGN PATENT DOCUMENTS

CA 2455689 A1 7/2005
CA 2957726 A1 3/2016
(Continued)

OTHER PUBLICATIONS

Aghniaey et al., "The Assumption of Equidistance in the Seven-Point Thermal Sensation Scale and a Comparison between Categorical and Continuous Metrics," University of Georgia College of Engineering, Jan. 18, 2019, 4 pages.
(Continued)

*Primary Examiner* — Yuhui R Pan
(74) *Attorney, Agent, or Firm* — Foley & Lardner LLP

(57) ABSTRACT

A controller includes a processing circuit comprising one or more processors and memory storing instructions that, when executed by the one or more processors, cause the one or more processors to perform operations. The operations include determining a gradient of an objective function with respect to a constraint variable used to define a constraint on a control process that uses the objective function and modifying the constraint variable to have a modified value in response to determining that a trigger condition is satisfied. The trigger condition is based on the gradient. The operations include performing the control process subject to the constraint using the modified value of the constraint variable
(Continued)

and operating equipment in accordance with a result of the control process.

20 Claims, 7 Drawing Sheets

Related U.S. Application Data of application No. 17/403,669, filed on Aug. 16, 2021, which is a continuation-in-part of application No. 17/393,138, filed on Aug. 3, 2021, which is a continuation of application No. 16/927,766, filed on Jul. 13, 2020, now Pat. No. 11,131,473, said application No. 17/403,669 is a continuation-in-part of application No. 16/927,759, filed on Jul. 13, 2020, now Pat. No. 11,269,306, application No. 17/576,615, filed on Jan. 14, 2022 is a continuation-in-part of application No. 16/555,591, filed on Aug. 29, 2019, now Pat. No. 11,226,600.

(60) Provisional application No. 63/246,177, filed on Sep. 20, 2021, provisional application No. 63/220,878, filed on Jul. 12, 2021, provisional application No. 63/194,771, filed on May 28, 2021, provisional application No. 63/044,906, filed on Jun. 26, 2020, provisional application No. 62/873,631, filed on Jul. 12, 2019.

(51) Int. Cl.
| | |
|---|---|
| *G05B 19/04* | (2006.01) |
| *F24F 11/70* | (2018.01) |
| *F24F 11/47* | (2018.01) |
| *F24F 11/64* | (2018.01) |
| *F24F 11/52* | (2018.01) |
| *F24F 8/10* | (2021.01) |
| *F24F 110/20* | (2018.01) |
| *F24F 140/60* | (2018.01) |
| *F24F 120/20* | (2018.01) |
| *F24F 110/10* | (2018.01) |
| *G06F 30/20* | (2020.01) |
| *F24F 8/22* | (2021.01) |

(52) U.S. Cl.
CPC .............. *F24F 11/64* (2018.01); *F24F 11/70* (2018.01); *F24F 8/22* (2021.01); *F24F 2110/10* (2018.01); *F24F 2110/20* (2018.01); *F24F 2120/20* (2018.01); *F24F 2140/60* (2018.01); *G05B 15/02* (2013.01); *G05B 19/04* (2013.01); *G05B 2219/2614* (2013.01); *G06F 30/20* (2020.01)

(58) Field of Classification Search
CPC .. F24F 11/52; F24F 11/64; F24F 11/70; F24F 8/22; F24F 2110/10; F24F 2110/20; F24F 2120/20; F24F 2140/60; G06F 30/20
See application file for complete search history.

(56) References Cited

U.S. PATENT DOCUMENTS

| | | |
|---|---|---|
| 5,550,752 A | 8/1996 | Federspiel |
| 6,033,302 A | 3/2000 | Ahmed et al. |
| 6,095,426 A | 8/2000 | Ahmed et al. |
| 6,988,671 B2 | 1/2006 | DeLuca |
| 7,025,281 B2 | 4/2006 | DeLuca |
| 7,099,895 B2 | 8/2006 | Dempsey |
| 7,150,408 B2 | 12/2006 | DeLuca |
| 7,222,494 B2 | 5/2007 | Peterson et al. |
| 7,311,752 B2 | 12/2007 | Tepper et al. |
| 7,394,370 B2 | 7/2008 | Chan |
| 7,580,775 B2 | 8/2009 | Kulyk et al. |
| 7,788,189 B2 | 8/2010 | Budike, Jr. |
| 7,817,046 B2 | 10/2010 | Coveley et al. |
| 7,894,946 B2 | 2/2011 | Kulyk et al. |
| 7,941,096 B2 | 5/2011 | Perkins et al. |
| 8,049,614 B2 | 11/2011 | Kahn et al. |
| 8,405,503 B2 | 3/2013 | Wong |
| 8,473,080 B2 | 6/2013 | Seem et al. |
| 8,527,108 B2 | 9/2013 | Kulyk et al. |
| 8,527,109 B2 | 9/2013 | Kulyk et al. |
| 8,862,448 B2 | 10/2014 | Holmes et al. |
| 8,867,993 B1 | 10/2014 | Perkins et al. |
| 8,918,223 B2 | 12/2014 | Kulyk et al. |
| 8,984,464 B1 | 3/2015 | Mihal et al. |
| 9,002,532 B2 | 4/2015 | Asmus |
| 9,075,909 B2 | 7/2015 | Almogy et al. |
| 9,110,647 B2 | 8/2015 | Kulyk et al. |
| 9,235,657 B1 | 1/2016 | Wenzel et al. |
| 9,383,736 B2 | 7/2016 | Honda et al. |
| 9,429,923 B2 | 8/2016 | Ward et al. |
| 9,436,179 B1 | 9/2016 | Turney et al. |
| 9,447,985 B2 | 9/2016 | Johnson |
| 9,465,392 B2 | 10/2016 | Bradley et al. |
| 9,612,601 B2 | 4/2017 | Beyhaghi et al. |
| 9,618,224 B2 | 4/2017 | Emmons et al. |
| 9,696,054 B2 | 7/2017 | Asmus |
| 9,703,339 B2 | 7/2017 | Kulyk et al. |
| 9,741,233 B2 | 8/2017 | Laufer et al. |
| 9,778,639 B2 | 10/2017 | Boettcher et al. |
| 9,810,441 B2 | 11/2017 | Dean-Hendricks et al. |
| 9,832,034 B2 | 11/2017 | Shetty et al. |
| 9,852,481 B1 | 12/2017 | Turney et al. |
| 9,915,438 B2 | 3/2018 | Cheatham et al. |
| 9,982,903 B1 | 5/2018 | Ridder et al. |
| 10,007,259 B2 | 6/2018 | Turney et al. |
| 10,068,116 B2 | 9/2018 | Good et al. |
| 10,088,814 B2 | 10/2018 | Wenzel et al. |
| 10,101,730 B2 | 10/2018 | Wenzel et al. |
| 10,101,731 B2 | 10/2018 | Asmus et al. |
| 10,139,877 B2 | 11/2018 | Kulyk et al. |
| 10,175,681 B2 | 1/2019 | Wenzel et al. |
| 10,190,789 B2 | 1/2019 | Mueller et al. |
| 10,198,779 B2 | 2/2019 | Pittman et al. |
| 10,251,610 B2 | 4/2019 | Parthasarathy et al. |
| 10,359,748 B2 | 7/2019 | Elbsat et al. |
| 10,418,833 B2 | 9/2019 | Wenzel et al. |
| 10,528,020 B2 | 1/2020 | Drees |
| 10,572,230 B2 | 2/2020 | Lucas et al. |
| 10,628,135 B2 | 4/2020 | Sharma et al. |
| 10,678,227 B2 | 6/2020 | Przybylski et al. |
| 10,706,375 B2 | 7/2020 | Wenzel et al. |
| 10,718,542 B2 | 7/2020 | Alanqar et al. |
| 10,871,756 B2 | 12/2020 | Johnson et al. |
| 10,884,398 B2 | 1/2021 | Elbsat et al. |
| 10,908,578 B2 | 2/2021 | Johnson et al. |
| 10,921,768 B2 | 2/2021 | Johnson et al. |
| 10,928,089 B2 | 2/2021 | Gamroth et al. |
| 10,928,784 B2 | 2/2021 | Craig et al. |
| 10,977,010 B2 | 4/2021 | Sharma et al. |
| 11,068,821 B2 | 7/2021 | Wenzel et al. |
| 11,156,978 B2 | 10/2021 | Johnson et al. |
| 11,164,126 B2 | 11/2021 | Elbsat et al. |
| 11,182,714 B2 | 11/2021 | Wenzel et al. |
| 2002/0165671 A1 | 11/2002 | Middya |
| 2004/0011066 A1 | 1/2004 | Sugihara et al. |
| 2006/0271210 A1 | 11/2006 | Subbu et al. |
| 2007/0101688 A1 | 5/2007 | Wootton et al. |
| 2007/0131782 A1 | 6/2007 | Ziehr et al. |
| 2007/0150333 A1 | 6/2007 | Hurst et al. |
| 2007/0202798 A1 | 8/2007 | Billiotte et al. |
| 2007/0203860 A1 | 8/2007 | Golden et al. |
| 2007/0219645 A1 | 9/2007 | Thomas et al. |
| 2008/0206767 A1 | 8/2008 | Kreiswirth et al. |
| 2008/0243273 A1 | 10/2008 | Robert et al. |
| 2008/0277486 A1 | 11/2008 | Seem et al. |
| 2009/0005912 A1 | 1/2009 | Srivastava et al. |
| 2009/0065596 A1 | 3/2009 | Seem et al. |

(56) References Cited

U.S. PATENT DOCUMENTS

| | | |
|---|---|---|
| 2009/0078120 A1 | 3/2009 | Kummer et al. |
| 2009/0117798 A1 | 5/2009 | Takashima et al. |
| 2009/0126382 A1 | 5/2009 | Rubino et al. |
| 2009/0173336 A1 | 7/2009 | Leifer et al. |
| 2009/0265106 A1 | 10/2009 | Bearman et al. |
| 2009/0292465 A1 | 11/2009 | Kaldewey et al. |
| 2010/0019050 A1 | 1/2010 | Han et al. |
| 2010/0047115 A1 | 2/2010 | Krichtafovitch et al. |
| 2010/0175556 A1 | 7/2010 | Kummer et al. |
| 2010/0198611 A1 | 8/2010 | Ruoff et al. |
| 2011/0018502 A1 | 1/2011 | Bianciotto et al. |
| 2011/0093249 A1 | 4/2011 | Holmes et al. |
| 2011/0172981 A1 | 7/2011 | Al-Hashimi et al. |
| 2011/0190946 A1 | 8/2011 | Wong et al. |
| 2011/0204720 A1 | 8/2011 | Ruiz et al. |
| 2011/0231320 A1 | 9/2011 | Irving |
| 2012/0112883 A1 | 5/2012 | Wallace et al. |
| 2012/0130547 A1 | 5/2012 | Fadell et al. |
| 2012/0199003 A1 | 8/2012 | Melikov et al. |
| 2013/0013123 A1 | 1/2013 | Ozaki |
| 2013/0162037 A1 | 6/2013 | Kim et al. |
| 2013/0204443 A1 | 8/2013 | Steven et al. |
| 2013/0245847 A1 | 9/2013 | Steven et al. |
| 2014/0039689 A1 | 2/2014 | Honda et al. |
| 2014/0039709 A1 | 2/2014 | Steven et al. |
| 2014/0167917 A2 | 6/2014 | Wallace et al. |
| 2014/0236869 A1* | 8/2014 | Fujimaki ............... G06N 20/00 706/11 |
| 2014/0260692 A1 | 9/2014 | Sharp |
| 2014/0283682 A1 | 9/2014 | Hamann et al. |
| 2015/0028114 A1 | 1/2015 | Rosen |
| 2015/0053366 A1 | 2/2015 | Melsheimer |
| 2015/0097688 A1 | 4/2015 | Bruck et al. |
| 2015/0109442 A1 | 4/2015 | Derenne et al. |
| 2015/0149257 A1 | 5/2015 | Bielat et al. |
| 2015/0190538 A1 | 7/2015 | Olvera et al. |
| 2015/0278968 A1 | 10/2015 | Steven et al. |
| 2015/0316901 A1 | 11/2015 | Wenzel et al. |
| 2015/0316902 A1 | 11/2015 | Wenzel et al. |
| 2015/0316903 A1 | 11/2015 | Asmus et al. |
| 2015/0316907 A1 | 11/2015 | Elbsat et al. |
| 2015/0331972 A1 | 11/2015 | McClure et al. |
| 2015/0354874 A1 | 12/2015 | Cur et al. |
| 2016/0066068 A1 | 3/2016 | Schultz et al. |
| 2016/0091904 A1* | 3/2016 | Horesh ............... G05D 23/1904 700/276 |
| 2016/0109149 A1 | 4/2016 | Heller |
| 2016/0116181 A1 | 4/2016 | Aultman et al. |
| 2016/0195866 A1 | 7/2016 | Turney et al. |
| 2016/0210337 A1 | 7/2016 | Constandt |
| 2016/0218543 A1 | 7/2016 | Ishida et al. |
| 2016/0306934 A1 | 10/2016 | Sperry et al. |
| 2016/0313751 A1 | 10/2016 | Risbeck et al. |
| 2016/0377306 A1 | 12/2016 | Drees et al. |
| 2017/0003676 A1* | 1/2017 | Yoshida ............ G05B 19/41835 |
| 2017/0011150 A1 | 1/2017 | Sons et al. |
| 2017/0016644 A1 | 1/2017 | Nagarathinam et al. |
| 2017/0031962 A1 | 2/2017 | Turney et al. |
| 2017/0039339 A1 | 2/2017 | Bitran et al. |
| 2017/0082305 A1 | 3/2017 | Law |
| 2017/0097163 A1 | 4/2017 | Law et al. |
| 2017/0097616 A1* | 4/2017 | Cozad ................... G06Q 10/06 |
| 2017/0102162 A1 | 4/2017 | Drees et al. |
| 2017/0102675 A1 | 4/2017 | Drees |
| 2017/0103483 A1 | 4/2017 | Drees et al. |
| 2017/0104336 A1 | 4/2017 | Elbsat et al. |
| 2017/0104337 A1 | 4/2017 | Drees |
| 2017/0104342 A1 | 4/2017 | Elbsat et al. |
| 2017/0104343 A1 | 4/2017 | Elbsat et al. |
| 2017/0104345 A1 | 4/2017 | Wenzel et al. |
| 2017/0104449 A1 | 4/2017 | Drees |
| 2017/0123440 A1 | 5/2017 | Mangsuli et al. |
| 2017/0147722 A1 | 5/2017 | Greenwood |
| 2017/0176030 A1 | 6/2017 | Emmons et al. |
| 2017/0179716 A1 | 6/2017 | Vitullo et al. |
| 2017/0193792 A1 | 7/2017 | Bermudez Rodriguez et al. |
| 2017/0206334 A1 | 7/2017 | Huang |
| 2017/0211837 A1 | 7/2017 | Gupta et al. |
| 2017/0212488 A1 | 7/2017 | Kummer et al. |
| 2017/0241658 A1 | 8/2017 | Salsbury et al. |
| 2017/0246331 A1 | 8/2017 | Lloyd |
| 2017/0292729 A1 | 10/2017 | Schuler et al. |
| 2017/0312379 A1 | 11/2017 | Stibich et al. |
| 2017/0350611 A1 | 12/2017 | Su et al. |
| 2017/0351832 A1 | 12/2017 | Cahan et al. |
| 2017/0352119 A1 | 12/2017 | Pittman et al. |
| 2018/0004171 A1 | 1/2018 | Patel et al. |
| 2018/0004172 A1 | 1/2018 | Patel et al. |
| 2018/0004173 A1 | 1/2018 | Patel et al. |
| 2018/0011459 A1 | 1/2018 | Boettcher et al. |
| 2018/0052970 A1 | 2/2018 | Boss et al. |
| 2018/0075549 A1 | 3/2018 | Turney et al. |
| 2018/0087791 A1 | 3/2018 | Monkkonen et al. |
| 2018/0110416 A1 | 4/2018 | Masuda et al. |
| 2018/0117209 A1 | 5/2018 | Clack et al. |
| 2018/0150601 A1 | 5/2018 | Astigarraga |
| 2018/0196456 A1 | 7/2018 | Elbsat |
| 2018/0197253 A1 | 7/2018 | Elbsat et al. |
| 2018/0204162 A1 | 7/2018 | Endel et al. |
| 2018/0209674 A1 | 7/2018 | Ridder et al. |
| 2018/0209675 A1 | 7/2018 | Ridder |
| 2018/0224814 A1 | 8/2018 | Elbsat et al. |
| 2018/0231967 A1 | 8/2018 | Cohen et al. |
| 2018/0254632 A1 | 9/2018 | Elbsat et al. |
| 2018/0259918 A1 | 9/2018 | Asmus et al. |
| 2018/0285800 A1 | 10/2018 | Wenzel et al. |
| 2018/0306459 A1 | 10/2018 | Turney |
| 2018/0313563 A1 | 11/2018 | Turney et al. |
| 2018/0314220 A1 | 11/2018 | Kumar et al. |
| 2018/0318746 A1 | 11/2018 | Thomas |
| 2018/0340704 A1 | 11/2018 | Turney et al. |
| 2018/0341255 A1 | 11/2018 | Turney et al. |
| 2018/0356770 A1 | 12/2018 | Elbsat et al. |
| 2018/0356782 A1 | 12/2018 | Elbsat et al. |
| 2018/0357577 A1 | 12/2018 | Elbsat et al. |
| 2018/0372355 A1 | 12/2018 | Mosamkar et al. |
| 2018/0372362 A1 | 12/2018 | Turney et al. |
| 2018/0375444 A1 | 12/2018 | Gamroth |
| 2019/0011145 A1 | 1/2019 | Willmott et al. |
| 2019/0020203 A1 | 1/2019 | Lang et al. |
| 2019/0025774 A1 | 1/2019 | Wenzel et al. |
| 2019/0032942 A1 | 1/2019 | Willmott et al. |
| 2019/0032943 A1 | 1/2019 | Willmott et al. |
| 2019/0032944 A1 | 1/2019 | Wenzel et al. |
| 2019/0032945 A1 | 1/2019 | Willmott et al. |
| 2019/0032947 A1 | 1/2019 | Willmott et al. |
| 2019/0032949 A1 | 1/2019 | Willmott et al. |
| 2019/0052120 A1 | 2/2019 | Huang et al. |
| 2019/0056126 A1 | 2/2019 | Law et al. |
| 2019/0066236 A1 | 2/2019 | Wenzel |
| 2019/0079473 A1 | 3/2019 | Kumar et al. |
| 2019/0096233 A1 | 3/2019 | Bruck et al. |
| 2019/0107825 A1 | 4/2019 | Wenzel et al. |
| 2019/0108746 A1 | 4/2019 | Chang et al. |
| 2019/0141526 A1 | 5/2019 | Bahrami et al. |
| 2019/0148023 A1 | 5/2019 | Sadilek et al. |
| 2019/0163213 A1 | 5/2019 | Ostrye et al. |
| 2019/0163216 A1 | 5/2019 | Ostrye |
| 2019/0209806 A1 | 7/2019 | Allen et al. |
| 2019/0213695 A1 | 7/2019 | Elbsat et al. |
| 2019/0216957 A1 | 7/2019 | Hawkins et al. |
| 2019/0219293 A1 | 7/2019 | Wenzel et al. |
| 2019/0235453 A1 | 8/2019 | Turney et al. |
| 2019/0245368 A1 | 8/2019 | Baumgartner et al. |
| 2019/0249897 A1 | 8/2019 | Alcala Perez et al. |
| 2019/0257544 A1 | 8/2019 | Alanqar et al. |
| 2019/0271978 A1 | 9/2019 | Elbsat et al. |
| 2019/0295034 A1 | 9/2019 | Wenzel et al. |
| 2019/0311332 A1 | 10/2019 | Turney et al. |
| 2019/0321504 A1 | 10/2019 | Dayton |
| 2019/0325368 A1 | 10/2019 | Turney et al. |
| 2019/0328920 A1 | 10/2019 | Stibich et al. |
| 2019/0331358 A1 | 10/2019 | Ritmanich et al. |
| 2019/0338974 A1 | 11/2019 | Turney et al. |

(56) References Cited

U.S. PATENT DOCUMENTS

| | | |
|---|---|---|
| 2019/0339661 A1 | 11/2019 | Pancholi et al. |
| 2019/0340709 A1 | 11/2019 | Elbsat et al. |
| 2019/0347622 A1 | 11/2019 | Elbsat et al. |
| 2020/0026249 A1 | 1/2020 | Przybylski et al. |
| 2020/0041158 A1 | 2/2020 | Turney et al. |
| 2020/0090089 A1 | 3/2020 | Aston et al. |
| 2020/0090289 A1 | 3/2020 | Elbsat et al. |
| 2020/0096958 A1 | 3/2020 | Kelly et al. |
| 2020/0096985 A1 | 3/2020 | Wenzel et al. |
| 2020/0103127 A1 | 4/2020 | Chen et al. |
| 2020/0110531 A1 | 4/2020 | Sarang et al. |
| 2020/0124307 A1 | 4/2020 | Ota et al. |
| 2020/0125045 A1 | 4/2020 | Risbeck et al. |
| 2020/0132328 A1 | 4/2020 | Boettcher et al. |
| 2020/0141734 A1 | 5/2020 | Casarez et al. |
| 2020/0149768 A1 | 5/2020 | Turney et al. |
| 2020/0176124 A1 | 6/2020 | Chatterjea et al. |
| 2020/0176125 A1 | 6/2020 | Chatterjea et al. |
| 2020/0193345 A1 | 6/2020 | Elbsat et al. |
| 2020/0193346 A1 | 6/2020 | Elbsat et al. |
| 2020/0200416 A1 | 6/2020 | Granger et al. |
| 2020/0218208 A1 | 7/2020 | Alanqar et al. |
| 2020/0218991 A1 | 7/2020 | Alanqar et al. |
| 2020/0227159 A1 | 7/2020 | Boisvert et al. |
| 2020/0301408 A1 | 9/2020 | Elbsat et al. |
| 2020/0319610 A1 | 10/2020 | Ray et al. |
| 2020/0327371 A1 | 10/2020 | Sharma et al. |
| 2020/0334967 A1 | 10/2020 | Sharma et al. |
| 2020/0348038 A1 | 11/2020 | Risbeck et al. |
| 2020/0355391 A1 | 11/2020 | Wenzel et al. |
| 2020/0356087 A1 | 11/2020 | Elbsat et al. |
| 2021/0010693 A1 | 1/2021 | Gamroth et al. |
| 2021/0010701 A1 | 1/2021 | Nesler et al. |
| 2021/0011443 A1 | 1/2021 | McNamara et al. |
| 2021/0011444 A1 | 1/2021 | Risbeck et al. |
| 2021/0018211 A1 | 1/2021 | Ellis et al. |
| 2021/0043330 A1 | 2/2021 | Ikeshima |
| 2021/0072742 A1 | 3/2021 | Wu et al. |
| 2021/0108821 A1 | 4/2021 | Turney et al. |
| 2021/0148592 A1 | 5/2021 | Turney et al. |
| 2021/0173366 A1 | 6/2021 | Turney et al. |
| 2021/0193309 A1 | 6/2021 | Boisvert et al. |
| 2021/0200169 A1 | 7/2021 | Ploegert et al. |
| 2021/0270490 A1 | 9/2021 | Turney et al. |
| 2021/0284040 A1 | 9/2021 | Grunkemeyer et al. |
| 2021/0313075 A1 | 10/2021 | McNamara et al. |
| 2021/0322613 A1 | 10/2021 | Lacaze et al. |
| 2021/0356916 A1 | 11/2021 | Wenzel et al. |
| 2021/0364181 A1 | 11/2021 | Risbeck et al. |
| 2021/0365861 A1 | 11/2021 | Elbsat et al. |
| 2021/0390807 A1 | 12/2021 | Chaurasia et al. |
| 2021/0390812 A1 | 12/2021 | Chaurasia et al. |
| 2021/0391089 A1 | 12/2021 | Eswara et al. |
| 2021/0398659 A1 | 12/2021 | Sharma et al. |
| 2021/0398690 A1 | 12/2021 | Gibson et al. |
| 2021/0398691 A1 | 12/2021 | Dhamija et al. |
| 2022/0011731 A1 | 1/2022 | Risbeck et al. |
| 2022/0042704 A1 | 2/2022 | Drees et al. |
| 2022/0060856 A1 | 2/2022 | Wellig et al. |
| 2022/0062463 A1 | 3/2022 | Ramer et al. |
| 2022/0065479 A1 | 3/2022 | Douglas et al. |
| 2022/0092500 A1 | 3/2022 | Drees et al. |
| 2022/0137580 A1 | 5/2022 | Burroughs et al. |
| 2022/0172830 A1 | 6/2022 | Brooks et al. |
| 2022/0186962 A1 | 6/2022 | Turney et al. |
| 2022/0268471 A1 | 8/2022 | Turney et al. |
| 2022/0284519 A1 | 9/2022 | Pancholi et al. |
| 2022/0299230 A1 | 9/2022 | Boettcher et al. |
| 2022/0335547 A1 | 10/2022 | Wenzel |
| 2022/0381471 A1 | 12/2022 | Wenzel et al. |
| 2022/0390137 A1 | 12/2022 | Wenzel et al. |
| 2023/0020417 A1 | 1/2023 | Elbsat et al. |

FOREIGN PATENT DOCUMENTS

| | | |
|---|---|---|
| CA | 3043996 A1 | 2/2018 |
| CN | 1916514 A | 2/2007 |
| CN | 101387428 A | 3/2009 |
| CN | 105805888 A | 7/2016 |
| CN | 106415139 A | 2/2017 |
| CN | 107250928 A | 10/2017 |
| CN | 107477782 A | 12/2017 |
| CN | 107787469 A | 3/2018 |
| CN | 108779925 A | 11/2018 |
| CN | 108980988 A | 12/2018 |
| CN | 109196286 A | 1/2019 |
| CN | 109405151 A | 3/2019 |
| CN | 110529988 A | 12/2019 |
| CN | 110671798 A | 1/2020 |
| CN | 110822616 A | 2/2020 |
| EP | 2 237 201 A1 | 10/2010 |
| EP | 2 504 807 A2 | 10/2012 |
| EP | 3 186 687 A4 | 7/2017 |
| EP | 3 497 377 A1 | 6/2019 |
| EP | 3 675 003 A1 | 7/2020 |
| FR | 3031800 A1 | 7/2016 |
| JP | 2010-128976 A | 6/2010 |
| JP | 2012-533720 A | 12/2012 |
| JP | 2015-152175 A | 8/2015 |
| JP | 2016-138705 A | 8/2016 |
| JP | 06-455326 B2 | 1/2019 |
| KR | 20160137767 A | 12/2016 |
| KR | 20170115913 A | 10/2017 |
| KR | 101865143 B1 | 6/2018 |
| KR | 20200047457 A | 5/2020 |
| WO | WO-2005/071815 A1 | 8/2005 |
| WO | WO-2009/157847 A1 | 12/2009 |
| WO | WO-2013/186282 A2 | 12/2013 |
| WO | WO-2016/047103 A1 | 3/2016 |
| WO | WO-2017/203031 A1 | 11/2017 |
| WO | WO-2019/051893 A1 | 3/2019 |
| WO | WO-2019/157514 A2 | 8/2019 |
| WO | WO-2021/258116 A1 | 12/2021 |

OTHER PUBLICATIONS

Aliabadi et al., "Preventing Airborne Disease Transmission: Review of Methods for Ventilation Design in Health Care Facilities," SAGE—Hindawi Access to Research Advances in Preventive Medicine, Feb. 2011, vol. 2011, 21 pages.

Azimi et al., "HVAC filtration for controlling infectious airborne disease transmission in indoor environments: Predicting risk reductions and operational costs," Building and Environment, May 13, 2013, 70, pp. 150-160.

Batterman et al., "Review and Extension of CO2-Based Methods to Determine Ventilation Rates with Application to School Classrooms," International Journal of Environmental Research and Public Health, Feb. 4, 22 pages.

Buaonanno et al., "Estimation of Airborne Viral Emission: Quanta Emission Rate of SARS-CoV-2 for Infection Risk Assessment," Environment International, 2020, 141, 105794, 9 pages.

CDC—Centers for Disease Control and Prevention, "How Flu Spreads," URL: https://www.cdc.gov/flu/about/disease/spread.htm, Aug. 27, 2018, 1 page.

CDC—Centers for Disease Control and Prevention, "Interim Clinical Guidance for Management of Patients with Confirmed Coronavirus Disease (COVID_19)," URL: https://www.cdc.gov/coronavirus/2019-ncov/hcp/clinical-guidance-management-patients.html, Feb. 2021, 14 pages.

Chen et al., "Occupant Feedback Based Model Predictive Control for Thermal Comfort and Energy Optimization: A Chamber Experimental Evaluation," Applied Energy, 2016, 164, pp. 341-351.

Ching, "An empirical drag coefficient model for simulating the dispersion and deposition of bioaerosol particles in ventilated environments," The Hong Kong Polytechnic University Department of Building Services Engineering, Jun. 2016, 345 pages.

CIRES—Cooperative Institute for Research in Environmental Sciences, "COVID-19 Airborne Transmission Tool Available: New

(56) References Cited

OTHER PUBLICATIONS model estimates COVID-19 transmission in classrooms, buses, protests, more," URL: https://cires.colorado.edu/news/covid-19-airborne-transmission-tool-available, Jun. 25, 2020, 7 pages.

Copeland, "The Impact of Patient Room Design on Airborne Hospital-Acquired Infections (HAI)," Thesis, Kent State University, Degree of Masters of Science in Architecture and Environmental Design, May 2016, 61 pages.

EPA—U.S. Environmental Protection Agency, "Exposure Factors Handbook," URL: https://www.epa.gov/expobox/about-exposure-factors-handbook, 2011, 6 pages.

EPA—U.S. Environmental Protection Agency, "Greenhouse Gases Equivalences Calculator—Calculations and References", URL: https://www.epa.gov/energy/greenhouse-gases-equivalencies-calculator-calculations-and-references, retrieved from the internet Sep. 30, 3031, 32 pages.

Fears et al., "Comparative Dynamic Aerosol Efficiencies of Three Emergent Coronaviruses and the Unusual Persistence of Sars-Cov-2 in Aerosol Suspensions," URL: https://www.ncbi.nlm.nih.gov/pmc/articles/PMC7217084/, Apr. 18, 2020, 8 pages.

International Search Report and Written Opinion on PCT/US2020/041770, dated Nov. 3, 2020, 13 pages.

International Search Report and Written Opinion on PCT/US2020/041792, dated Sep. 30, 15 pages.

International Search Report and Written Opinion on PCT/US2020/041845, dated Jan. 13, 2021, 20 pages.

Joe et al., "Methodology for Modeling the Microbial Contamination of Air Filters," PLoS One 9(2) e88514, URL: https://doi.org/10.1371/journal.pone.0088514, Feb. 11, 2014, 9 pages.

Johnson et al., "Modality of human expired aerosol size distributions," Journal of Aerosol Science, 2011, 42(12), pp. 839-851.

Kanaan et al., "New airborne pathogen transport model for upper-room UVGI spaces conditioned by chilled ceiling and mixed displacement ventilation: Enhancing air quality and energy performance," Energy Conversion and Management, Apr. 12, 2014, 85, pp. 50-61.

Kang et al., "Novel Modeling and Control Strategies for a HVAC System Including Carbon Dioxide Control," Energies, Jun. 2, 2014, 7, pp. 3599-3617.

Kowalski, W., "Ultraviolet germicidal irradiation handbook: UVGI for air and surface disinfection," Springer Science & Business Media, 2010, 504 pages.

Kumar, "A Simulation Framework to Characterize the Effect of Ventilation Control on Airborne Infectious Disease Transmission in Schools," Thesis, Graduate School of The University of Texas at Austin, May 2019, 53 pages.

Lampinen, "Thermodynamics of Humid Air," Sep. 2015, 39 Pages.

Liao et al., "A Probabilistic Transmission Dynamic Model to Assess Indoor Airborne Infection Risks," Risk Analysis, 2005, vol. 25, No. 5, pp. 1097-1107.

Ljung, System Identification: Theory for the User, 1999, 2nd ed., Prentice Hall PTR, Upper Saddle River, 63 pages.

Luo, "Maximizing Thermal Comfort and International Design: Predicting Thermal Comfort in Mixed-mode Office Building in the UK," Loughborough University, Jan. 18, 2019, 4 pages.

Marr et al., "SARS-CoV-2 in Indoor Air: Principles and Scenarios," US EPA Indoor Air Quality Science Webinar, YouTube URL: https://www.youtube.com/watch?v=fSQ0ah_OArU, Jul. 21, 2020, 113 pages.

National Geographic, "Measure the risk of airborne COVID-19 in your office, classroom, or bus ride," URL: https://www.nationalgeographic.com/science/article/how-to-measure-risk-airborne-coronavirus-your-office-classroom-bus-ride-cvd, Aug. 11, 2020, 12 pages.

Noakes et al., "Applying the Wells-Riley equation to the risk of airborne infection in hospital environments: The importance of stochastic and proximity effects," Indoor Air 2008, The 11th Intl Conference on Indoor Air Quality and CI, Aug. 17-22, 2008, Copenhagen, Denmark, 9 pages.

Noakes et al., "Mathematical models for assessing the role of airflow on the risk of airborne infection in hospital wards," Journal of the Royal Society Interface, 2009, 6, S791-S800, 10 pages.

Noakes et al., "Modelling the transmission of airborne infections in enclosed spaces," Epidemiol. Infect, 2006, vol. 134, pp. 1082-1091.

Stephens, "HVAC filtration and the Wells-Riley approach to assessing risks of infectious airborne diseases," The National Air Filtration Association (NAFA) Foundation, Mar. 1, 2012, 47 pages.

Sudhakaran et al., "Temperature, Relative Humidity, and Carbon-Dioxide Modulation in a Near-Zero Energy Efficient Retrofit House," Purdue University, 2016, 11 pages.

Sze et al., "Review and Comparison Between the Wells-Riley and Dose-Response Approaches to Risk Assessment of Infectious Respiratory Diseases," Indoor Air, 2010, 20, pp. 2-16.

Van Doremalen et al., "Aerosol and Surface Stability of SARS-CoV-2 as Compared with SARS-CoV-1," URL: https://www.nejm.org/doi/full/10.1056/nejmc2004973, Mar. 17, 2020, 5 pages.

Weekly et al., "Modeling and Estimation of the Humans' Effect on the CO2 Dynamics Inside a Conference Room," IEEE Transactions on Control Systems Technology, Sep. 2015, 23.5, 12 pages.

International Preliminary Report on Patentability on PCT Appl. Ser. No. PCT/US2020/041770 dated Jan. 27, 2022 (8 pages).

International Preliminary Report on Patentability on PCT Appl. Ser. No. PCT/US2020/041792 dated Jan. 27, 2022 (9 pages).

International Preliminary Report on Patentability on PCT Appl. Ser. No. PCT/US2020/041845 dated Jan. 27, 2022 (12 pages).

U.S. Appl. No. 16/370,632, filed Mar. 29, 2019, Johnson Controls Technology Company.

U.S. Appl. No. 17/582,988, filed Jan. 24, 2022, Johnson Controls Tyco IP Holdings LLP.

U.S. Appl. No. 17/686,320, filed Mar. 3, 2022, Johnson Controls Tyco IP Holdings LLP.

U.S. Appl. No. 17/733,786, filed Apr. 29, 2022, Johnson Controls Tyco IP Holdings LLP.

Hubert et al., Modeling for Residential Electricity Optimization in Dynamic Pricing Environments, IEEE Transactions on Smart Grid, IEEE, USA, Dec. 1, 2012, vol. 3, No. 4 (pp. 2224-2231).

International Preliminary Report Patentability on PCT Appl. Ser. No. PCT/US2018/039119 dated Jan. 2, 2020 (7 pages).

International Search Report and Written Opinion on International Appl. Ser. No. PCT/US2018/039119 dated Oct. 5, 2018 (14 pages).

Invitation to Pay Additional Fees and, Where Applicable, Protest Fee on PCT Appl. No. PCT/US2022/031438 dated Sep. 2, 2022 (14 pages).

U.S. Appl. No. 17/668,791, filed Feb. 10, 2022, Johnson Controls Tyco IP Holdings LLP.

U.S. Appl. No. 17/688,054, filed Mar. 7, 2022, Johnson Controls Technology Company.

U.S. Appl. No. 17/692,642, filed Mar. 11, 2022, Johnson Controls Tyco IP Holdings LLP.

U.S. Appl. No. 17/697,772, filed Mar. 17, 2022, Johnson Controls Tyco IP Holdings LLP.

U.S. Appl. No. 17/826,916, filed May 27, 2022, Johnson Controls Tyco IP Holdings LLP.

U.S. Appl. No. 17/826,921, filed May 27, 2022, Johnson Controls Tyco IP Holdings LLP.

U.S. Appl. No. 17/827,439, filed May 27, 2022, Johnson Controls Tyco IP Holdings LLP.

U.S. Appl. No. 17/839,082, filed Jun. 13, 2022, Johnson Controls Tyco IP Holdings LLP.

Chinese Office Action on CN Appl. No. 202080057416.0 dated Dec. 30, 2022 (12 pages).

Coolinglogic, "CoolingLogic: Up early, saving billions." URL: http://coolinglogic.com/documents/MarketingFlyer_FINAL_HiRes8.5x11.pdf, retrieved from internet Oct. 27, 2022 (1 page).

Incomplete File of Communication with Various Companies, etc. in 2016-2021, URL: http://coolinglogic.com/documents/22072101_Letters_and_Signature_Receipts.pdf, published, as one document, on: Jul. 21, 2022 (211 pages).

International Search Report and Written Opinion on PCT Appl. No. PCT/US2022/031438 dated Nov. 8, 2022 (18 pages).

International Search Report and Written Opinion on PCT Appl. No. PCT/US2022/040332 dated Nov. 22, 2022 (18 pages).

(56) References Cited

OTHER PUBLICATIONS

International Search Report and Written Opinion on PCT Appl. No. PCT/US2022/044034 dated Dec. 20, 2022 (12 pages).
Johnson Heating and Cooling L.L.C., "Divine Grace Building Automation (Images)," URL: http://cooljohnson.com/Building-Automation-Systems-Michigan/Oakland-County-Michigan/Building-Automation-lmages.html, retrieved from internet Oct. 27, 2022 (8 pages).
Johnson Heating and Cooling L.L.C., "Divine Grace Building Automation," URL: http://cooljohnson.com/Building-Automation-Systems-Michigan/Oakland-County-Michigan/Building-Automation-Divine-Grace.html, retrieved from internet Oct. 27, 2022 (3 pages).
Johnson Heating and Cooling L.L.C., "Excel Rehabilitation Building Automation," URL: http://cooljohnson.com/Building-Automation-Systems-Michigan/Waterford-Michigan/Building-Automation-System-Excel.html, retrieved from internet Oct. 27, 2022 (2 pages).
Johnson Heating and Cooling L.L.C., "Intertek Testing Services Building Automation," URL: http://cooljohnson.com/Building-Automation-Systems-Michigan/Plymouth-Michigan/Building-Automation-System-Plymouth-Michigan.html, retrieved from internet Oct. 27, 2022 (8 pages).
Johnson Heating and Cooling L.L.C., "JLA Medical Building Building Automation," URL: http://cooljohnson.com/Building-Automation-Systems-Michigan/Waterford-Michigan/Building-Automation-System-JLA.html, retrieved from internet Oct. 27, 2022 (3 pages).
Johnson Heating and Cooling L.L.C., "Mosaic Christian Building Automation (Images)," URL: http://cooljohnson.com/Building-Automation-Systems-Michigan/Detroit/Building-Automation-lmages.html, retrieved from internet Oct. 27, 2022 (12 pages).
Johnson Heating and Cooling L.L.C., "Mosaic Christian Building Automation," URL: http://cooljohnson.com/Building-Automation-Systems-Michigan/Detroit/Mosaic-Christian.html, retrieved from internet Oct. 27, 2022 (5 pages).
Johnson Heating and Cooling L.L.C., "Shepherd's Gate Lutheran Church Building Automation," URL: http://cooljohnson.com/Building-Automation-Systems-Michigan/Shelby-Township-Michigan/Building-Automation-Systems-SG.html, retrieved from internet Oct. 27, 2022 (3 pages).
Johnson Heating and Cooling L.L.C., "St. Clair County Residence Building Automation," URL: http://cooljohnson.com/Building-Automation-Systems-Michigan/St-Clair-Michigan/Building-Automation-System-St-Clair-Michigan.html, retrieved from internet Oct. 27, 2022 (4 pages).
Johnson Heating and Cooling L.L.C., "St. Joseph Mercy Oakland U. C. Building Automation," URL: http://cooljohnson.com/Building-Automation-Systems-Michigan/Waterford-Michigan/Building-Automation-Systems-SJMO.html, retrieved from internet Oct. 27, 2022 (2 pages).
Johnson Heating and Cooling L.L.C., "Waterford Internal Medicine Building Automation," URL: http://cooljohnson.com/Building-Automation-Systems-Michigan/Waterford-Michigan/Building-Automation-Systems-WIM.html, retrieved from internet Oct. 27, 2022 (3 pages).
Johnson Heating and Cooling, LLC, "Building Automation Clawson Michigan 2.0," URL: http://cooljohnson.com/Building-Automation-Systems-Michigan/Clawson-Michigan/Building-Automation-Clawson-Manor-2.html, retrieved from the internet Oct. 27, 2022 (6 pages).
Johnson Heating and Cooling, LLC, "Building Automation Images Clawson Michigan 2.0," URL: http://cooljohnson.com/Building-Automation-Systems-Michigan/Clawson-Michigan/Building-Automation-Clawson-Manor-2-lmages.html, retrieved from the internet Oct. 27, 2022 (14 pages).
Johnson Heating and Cooling, LLC, "Building Automation System Clawson Michigan Clawson Manor," URL: http://cooljohnson.com/Building-Automation-Systems-Michigan/Clawson-Michigan/Building-Automation-System-Clawson-Manor.html; retrieved from the internet Oct. 27, 2022 (3 pages).
Johnson Heating and Cooling, LLC, "Building Automation System in Michigan Images," URL: http://cooljohnson.com/Building-Automation-Systems-Michigan/Macomb-County-Michigan/Building-Automation-lmages.html; retrieved from the internet Oct. 27, 2022 (13 pages).
Johnson Heating and Cooling, LLC, "Building Automation System in Michigan," URL: http://cooljohnson.com/Building-Automation-Systems-Michigan/Macomb-County-Michigan/Building-Automation-Confidential-Customer.html; retrieved from the internet, Oct. 27, 2022 (4 pages).
Johnson Solid State LLC, "Building Automation Equipment," URL: http://cooljohnson.com/Video/Building_Automation/Confidential_Customer_BLD_2/Building_Automation_Equipment.mp4, retrieved from internet Oct. 27, 2022 (35 pages).
Johnson Solid State LLC, "Building Automation Gui," Url: http://cooljohnson.com/Video/Building_Automation/Confidential_Customer_BLD_2/Building_Automation_GUI.mp4, retrieved from internet Oct. 27, 2022 (24 pages).
Johnson Solid State LLC, "Cooling Logic Overview," URL: http://coolinglogic.com/documents/CoolingLogic_Overview_High_Quality.mp4, retrieved from internet Oct. 27, 2022 (16 pages).
Johnson Solid State LLC, "So what is CoolingLogic™?" URL: http://coolinglogic.com/Coolinglogic-How-it-Works.html, retrieved from the internet Oct. 27, 2022 (3 pages).
Johnson, David, "A Method to Increase HVAC System Efficiency And Decrease Energy Consumption," White Paper: Johnson Solid State, LLC, URL: http://coolinglogic.com/documents/16102106_White_Paper_High_Resolution_Protected.pdf, Sep. 24, 2016 (51 pages).
Johnson, David, "CoolingLogic™: Changing the Way You Cool," Report: Johnson Solid State, LLC, URL: http://coolinglogic.com/documents/18111303_Changing_the_way_you_Cool.pdf, Nov. 7, 2018 (12 pages).
Johnson, David, "CoolingLogic™: Mosaic Christian Church A Case Study," Report: Johnson Solid State, LLC, URL: http://coolinglogic.com/documents/19020301_Mosaic_Christian_Coolinglogic_Case_Study.pdf, Feb. 2, 2019 (140 pages).
Johnson, David, "Excel Rehabilitation Building Automation: Building Automation System User Manual ," URL: http://cooljohnson.com/Building-Automation-Systems-Michigan/Waterford-Michigan/Building-Automation-System-Excel-Manual.html, 2012 (10 pages).
Johnson, David, "Temperature Control System and Methods for Operating Same," Pre-Publication printout of U.S. Appl. No. 15/231,943, filed Aug. 9, 2016, URL: http://coolinglogic.com/documents/16080901_CIP_As_Filed.pdf (99 pages).
Noakes et al., "Appraising healthcare ventilation design from combined infection control and energy perspective," HVAC & R Research, Aug. 2012, (20 pages).
EPO Provisional Opinion Accompanying the Partial Search Result for PCT Appl. Ser. No. PCT/US2023/012719 dated Mar. 28, 2023 (15 pages).
European Office Action on EP Appl. No. 20750965.4 dated Mar. 31, 2023 (5 pages).
International Search Report and Written Opinion on PCT Appl. Ser. No. PCT/US2023/012719 dated May 22, 2023 (20 pages).

* cited by examiner

BUILDING CONTROL SYSTEM WITH LOAD CURTAILMENT OPTIMIZATION

CROSS-REFERENCE TO RELATED PATENT APPLICATIONS

This application is a continuation-in-part of U.S. patent application Ser. No. 16/555,591 filed Aug. 29, 2019. This application also claims the benefit of and priority to U.S. Provisional Patent Application No. 63/246,177 filed Sep. 20, 2021, and U.S. Provisional Application No. 63/220,878, filed Jul. 12, 2021. This application is also a continuation-in-part of U.S. patent application Ser. No. 17/483,078 filed Sep. 23, 2021, which is a continuation-in-part of U.S. patent application Ser. No. 17/403,669, filed Aug. 16, 2021, which is a continuation-in-part of U.S. application Ser. No. 16/927,759 filed Jul. 13, 2020, which claims the benefit of and priority to U.S. Provisional Patent Application No. 62/873,631 filed Jul. 12, 2019, and U.S. Provisional Patent Application No. 63/044,906 filed Jun. 26, 2020. U.S. patent application Ser. No. 17/403,669 is also a continuation-in-part of U.S. patent application Ser. No. 17/393,138 filed Aug. 3, 2021, which is a continuation of U.S. patent application Ser. No. 16/927,766 filed Jul. 13, 2020 (now U.S. Pat. No. 11,131,473), which claims the benefit of and priority to U.S. Provisional Patent Application No. 62/873,631 filed Jul. 12, 2019, and U.S. Provisional Patent Application No. 63/044,906 filed Jun. 26, 2020. U.S. patent application Ser. No. 17/483,078 also claims the benefit of and priority to U.S. Provisional Application No. 63/194,771, filed May 28, 2021, and U.S. Provisional Application No. 63/220,878, filed Jul. 12, 2021. The entire disclosures of all of these patent applications are incorporated by reference herein.

BACKGROUND

The present disclosure relates generally to a central plant or central energy facility configured to serve the energy loads of a building or campus. The present disclosure also relates to a central plant with an asset allocator configured to determine an optimal distribution of the energy loads across various subplants of the central plant during curtailment periods.

A central plant typically includes multiple subplants configured to serve different types of energy loads. For example, a central plant may include a chiller subplant configured to serve cooling loads, a heater subplant configured to serve heating loads, and/or an electricity subplant configured to serve electric loads. A central plant purchases resources from utilities to run the subplants to meet the loads.

Some central plants are controlled based on a load profile that is generated to characterize the production and consumption of energy by the building. In the presence of a large building load, it may not be possible for a load profile to be met by existing building equipment. As a result, the load is curtailed by forcing the building in uncomfortable conditions.

SUMMARY

One implementation of the present disclosure is a controller including a processing circuit having one or more processors and memory storing instructions that, when executed by the one or more processors, cause the one or more processors to perform operations. The operations include determining a gradient of an objective function with respect to a constraint variable used to define a constraint on a control process that uses the objective function and modifying the constraint variable to have a modified value in response to determining that a trigger condition is satisfied. The trigger condition is based on the gradient. The operations include performing the control process subject to the constraint using the modified value of the constraint variable and operating equipment in accordance with a result of the control process.

In some embodiments, the objective function includes a carbon emissions control objective indicating an amount of carbon emissions associated with operating the equipment, the constraint variable defines a required load to be served by the equipment, and the gradient of the objective function comprises a gradient of the carbon emissions control objective with respect to the required load.

In some embodiments, the objective function includes a disease transmission risk control objective indicating a risk of disease transmission associated with operating the equipment. The constraint variable defines a ventilation rate to be achieved by operating the equipment, and the gradient of the objective function includes a gradient of the disease transmission risk control objective with respect to the ventilation rate.

In some embodiments, the objective function includes an occupant comfort control objective indicating occupant comfort associated with operating the equipment. The constraint variable defines a required load to be served by the equipment, and the gradient comprises a gradient of the occupant comfort control objective with respect to the required load.

In some embodiments, the objective function includes a monetary cost control objective indicating a monetary cost of operating the equipment. The constraint variable defines a required load to be served by the equipment, and the gradient comprises a gradient of the monetary cost control objective with respect to the required load.

In some embodiments, the objective function includes a plurality of control objectives. The gradient may include at least one of a control objective specific gradient for each of the plurality of control objectives with respect to the constraint variable or a gradient of an overall value of the objective function with respect to the constraint variable.

In some embodiments, performing the control process includes performing an optimization of the objective function subject to the constraint.

In some embodiments, determining the gradient of the objective function with respect to the constraint variable includes performing the control process using an initial value of the constraint variable to generate an initial result of the control process and determining the gradient of the objective function with respect to the constraint variable at a point defined by the initial result of the control process.

In some embodiments, determining whether the trigger condition is satisfied includes comparing the gradient to a threshold value and determining that the trigger condition is satisfied based on whether the gradient exceeds the threshold value.

In some embodiments, determining whether the trigger condition is satisfied includes presenting the gradient to a user and determining that the trigger condition is satisfied in response to the user providing a request to modify the constraint variable.

Another implementation of the present disclosure is a method including determining a gradient of an objective function with respect to a constraint variable used to define a constraint on a control process that uses the objective function and modifying the constraint variable to have a modified value in response to determining that a trigger condition is satisfied. The trigger condition is based on the gradient. The method includes performing the control process subject to the constraint using the modified value of the constraint variable and operating equipment in accordance with a result of the control process.

In some embodiments, the objective function includes a carbon emissions control objective indicating an amount of carbon emissions associated with operating the equipment, the constraint variable defines a required load to be served by the equipment, and the gradient of the objective function comprises a gradient of the carbon emissions control objective with respect to the required load.

In some embodiments, the objective function includes a disease transmission risk control objective indicating a risk of disease transmission associated with operating the equipment, the constraint variable defines a ventilation rate to be achieved by operating the equipment, and the gradient of the objective function comprises a gradient of the disease transmission risk control objective with respect to the ventilation rate.

In some embodiments, the objective function includes an occupant comfort control objective indicating occupant comfort associated with operating the equipment, the constraint variable defines a required load to be served by the equipment, and the gradient comprises a gradient of the occupant comfort control objective with respect to the required load.

In some embodiments, the objective function includes a monetary cost control objective indicating a monetary cost of operating the equipment, the constraint variable defines a required load to be served by the equipment, and the gradient comprises a gradient of the monetary cost control objective with respect to the required load.

In some embodiments, the objective function includes a plurality of control objectives. The gradient may include at least one of a control objective specific gradient for each of the plurality of control objectives with respect to the constraint variable or a gradient of an overall value of the objective function with respect to the constraint variable.

In some embodiments, performing the control process includes performing an optimization of the objective function subject to the constraint.

In some embodiments, determining the gradient of the objective function with respect to the constraint variable includes performing the control process using an initial value of the constraint variable to generate an initial result of the control process and determining the gradient of the objective function with respect to the constraint variable at a point defined by the initial result of the control process.

In some embodiments, determining whether the trigger condition is satisfied includes comparing the gradient to a threshold value and determining that the trigger condition is satisfied based on whether the gradient exceeds the threshold value.

In some embodiments, determining whether the trigger condition is satisfied includes presenting the gradient to a user and determining that the trigger condition is satisfied in response to the user providing a request to modify the constraint variable.

Another implementation of the present disclosure is a controller including a processing circuit comprising processors and memory storing instructions that, when executed by the processors, cause the processors to perform operations. The operations include performing a first optimization of an objective function subject to a first constraint to generate a first optimization result, the first constraint defining a first value of a constraint variable, automatically modifying the constraint variable to have a modified value based on a gradient of an output of the objective function with respect to the constraint variable performing a second optimization of the objective function subject to a second constraint to generate a second optimization result, the second constraint defining the modified value of the constraint variable, and operating equipment in accordance with the second optimization result.

In some embodiments, the first optimization result comprises a first value for a dual variables representing the gradient with respect to one of the constraint variable.

In some embodiments, the constraint variable comprises a required load variable for a resource, the required load variable defining a production amount of one of the resource required by a building at each of a plurality of time steps.

In some embodiments, the operations further comprise modifying at least one of a plurality of required load variables to reduce an amount of one or more of a resource required by a building, thereby reducing a cost resulting from the second optimization of the objective function relative to the cost resulting from the first optimization of the objective function.

In some embodiments, the operations further comprise recommending the changes to one or more of the constraint variable in response to a determination that an amount of a resources required by a building exceeds a production amount of the resource capable of being produced by a subplant during a portion of a time period.

In some embodiments, the operations further comprise presenting, to a user on a user device, the gradient with respect to the constraint variable and a recommended change to the constraint variable based on the gradient associated therewith and modifying the constraint variable to have the modified value based on a user selection of the recommended change.

In some embodiments, the operations further comprise determining a gradient threshold value based on a user selection of one or more changes to the constraint variable and the gradient associated therewith, wherein the gradient threshold value defines a minimum gradient value by which the controller selects the one or more changes.

In some embodiments, the first optimization result includes first values for a dual variable, the dual variable representing the gradient of the cost with respect to one of the constraint variables.

In some embodiments, the constraint variables include a required load variable for each of the resources, the required load variable defining an amount of one of the resources required by the building at each of the time steps.

In some embodiments, modifying the constraint variable further comprises presenting, to a user on a user device, the gradient with respect to the constraint variable and modifying the constraint variable based on a user input defining the modified value to the constraint variable.

Another implementation of the present disclosure is a method for controlling a central plant operating to serve one or more energy loads of a building. The method comprises performing a first optimization of an objective function subject to a first constraint to generate a first optimization result, the first constraint defining a first value of a constraint variable, modifying the constraint variable to have a modified value based on a gradient of an output of the objective function with respect to the constraint variables, performing a second optimization of the objective function subject to a second constraint to generate a second optimization result, the second constraint defining the modified value of the constraint variable, and operating equipment in accordance with the second optimization result.

In some embodiments, performing the first optimization further comprises generating the first value for a dual variable representing the gradient of the cost with respect to one of the plurality of constraint variables.

In some embodiments, recommending changes to one or more of the plurality of constraint variables further comprises generating a cost savings expected to result from modifying one or more of the plurality of constraint variables.

In some embodiments, recommending changes to one or more constraint variables further comprises determining that a curtailment incentive is available in exchange for reducing the amount of one or more of the plurality of resources consumed by the building during a portion of the time period.

In some embodiments, modifying one or more of the plurality of constraint variables involves modifying the one or more of the plurality of constraints variables based on a user selection of one or more changes to the plurality of constraint variables.

In some embodiments, determining a gradient threshold value based on a user selection of one or more changes to the constraint variable and the gradient associated therewith, wherein the gradient threshold value defines a minimum gradient value by which the controller selects the one or more changes.

In some embodiments, modifying the constraint variable further involves comparing the gradient with the gradient threshold value to determine the modified value by which the constraint variable is modified.

In some embodiments, modifying the constraint variable further comprises presenting, to a user on a user device, the gradient with respect to the constraint variable and modifying the constraint variable based on a user input defining the modified value to the constraint variable.

In some embodiments, determining a gradient threshold value based on a user selection of one or more changes to the constraint variable and the gradient associated therewith, wherein the gradient threshold value defines a minimum gradient value by which the controller selects the one or more changes.

In some embodiments, modifying the constraint variable further involves comparing the gradient with the gradient threshold value to determine the modified value by which the constraint variable is modified.

In some embodiments, modifying the constraint variable further comprises presenting, to a user on a user device, the gradient with respect to the constraint variable and modifying the constraint variable based on a user input defining the modified value to the constraint variable.

Yet another implementation a control system for building equipment. The control system comprises a controller comprising a processing circuit comprising one or more processors and memory storing instructions that, when executed by the one or more processors, cause the one or more processors to perform operations comprising performing a first optimization of an objective function subject to a first constraint to generate a first optimization result, the first constraint defining a first value of a constraint variable, modifying the constraint variable to have a modified value based on a gradient of an output of the objective function with respect to the constraint variable performing a second optimization of the objective function subject to a second constraint to generate a second optimization result, the second constraint defining the modified value of the constraint variable, and operating equipment in accordance with the second optimization result.

In some embodiments, the constraint variable comprises a required load variable defining the amount of a resource required by the building equipment at each of a plurality of time steps.

In some embodiments, the operations further comprise modifying at least one of a plurality of required load variables to reduce an amount of one or more resources required by the building equipment, thereby reducing a cost resulting from the second optimization of the objective function relative to the cost resulting from the first optimization of the objective function.

In some embodiments, the operations further comprise recommending a change to the constraint variable in response to a determination that an amount of one or more resources required by the building equipment exceeds a production amount of the one or more resources capable of being produced during a portion of a time period.

In some embodiments, the memory stores one or more predetermined control actions used to determine a control signal based on an amount of load curtailment.

Another implementation of the present disclosure is one or more non-transitory computer-readable media storing instructions that, when executed by one or more processors, cause the one or more processors to perform operations. The operations include obtaining an objective function comprising a carbon emissions control objective indicating an amount of carbon emissions predicted to result from operating equipment in accordance with a set of control decisions, determining a gradient of the objective function with respect to a constraint variable defining a load to be served by operating the equipment, curtailing the load to be served by operating the equipment and modifying the constraint variable to have a curtailed load value in response to the gradient exceeding a threshold, performing a control process subject to the constraint using the curtailed load value to generate the set of control decisions, and operating the equipment in accordance with the set of control decisions.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Overview

Referring generally to the FIGURES, a central plant with an asset allocator and components thereof are shown, according to various exemplary embodiments. The asset allocator can be configured to manage energy assets such as central plant equipment, battery storage, and other types of equipment configured to serve the energy loads of a building. The asset allocator can determine an optimal distribution of heating, cooling, electricity, and energy loads across different subplants (i.e., equipment groups) of the central plant capable of producing that type of energy. Although described below with respect to a central path, the systems and methods described herein can be utilized in applications outside of a central plant including but not limited to other building management systems (BMSs) to heating ventilating or air conditioning (HVAC) systems.

In some embodiments, the asset allocator is configured to control the distribution, production, storage, and usage of resources in the central plant. The asset allocator can be configured to minimize the economic cost (or maximize the economic value) of operating the central plant over a duration of an optimization period. The economic cost may be defined by a cost function $J(x)$ that expresses economic cost as a function of the control decisions made by the asset allocator. The cost function $J(x)$ may account for the cost of resources purchased from various sources, as well as the revenue generated by selling resources (e.g., to an energy grid) or participating in incentive programs.

In some embodiments, the asset allocator performs an optimization process determine an optimal set of control decisions for each time step within the optimization period. In some embodiments, one or more of the outputs of the optimization process is a definition of one or more constraint variables. The asset allocator may be configured to recommend changes to one or more of the constraint variables based on load curtailment, cost savings, or cost gradient of the constraint variables. In some embodiments, the asset allocator performs a second optimization including updated constraints based on the recommended changes to one or more of the constraint variables in order to further minimize energy consumption by the building and/or maximize economic value.

Building and HVAC System

Figure 1:
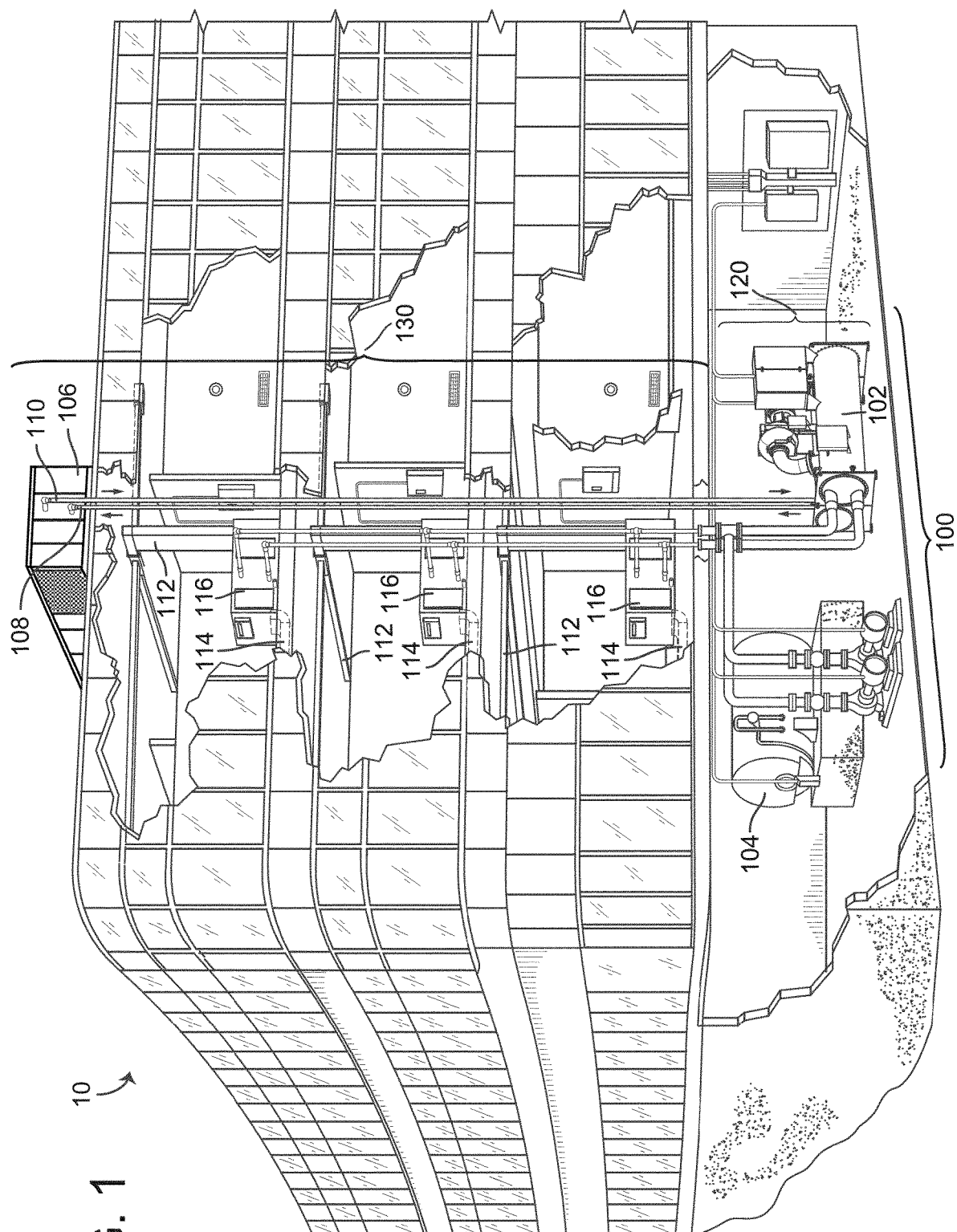
FIG. 1 is a drawing of a building equipped with a HVAC system, according to an exemplary embodiment.

Referring now to FIG. 1, a perspective view of a building 10 is shown. Building 10 can be served by a building management system (BMS). A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof. An example of a BMS which can be used to monitor and control building 10 is described in U.S. patent application Ser. No. 14/717,593 filed May 20, 2015, the entire disclosure of which is incorporated by reference herein.

The BMS that serves building 10 may include a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. In some embodiments, waterside system 120 can be replaced with or supplemented by a central plant or central energy facility (described in greater detail with reference to FIG. 2). An example of an airside system which can be used in HVAC system 100 is described in greater detail with reference to FIG. 3.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements.

AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Central Plant

Figure 2:
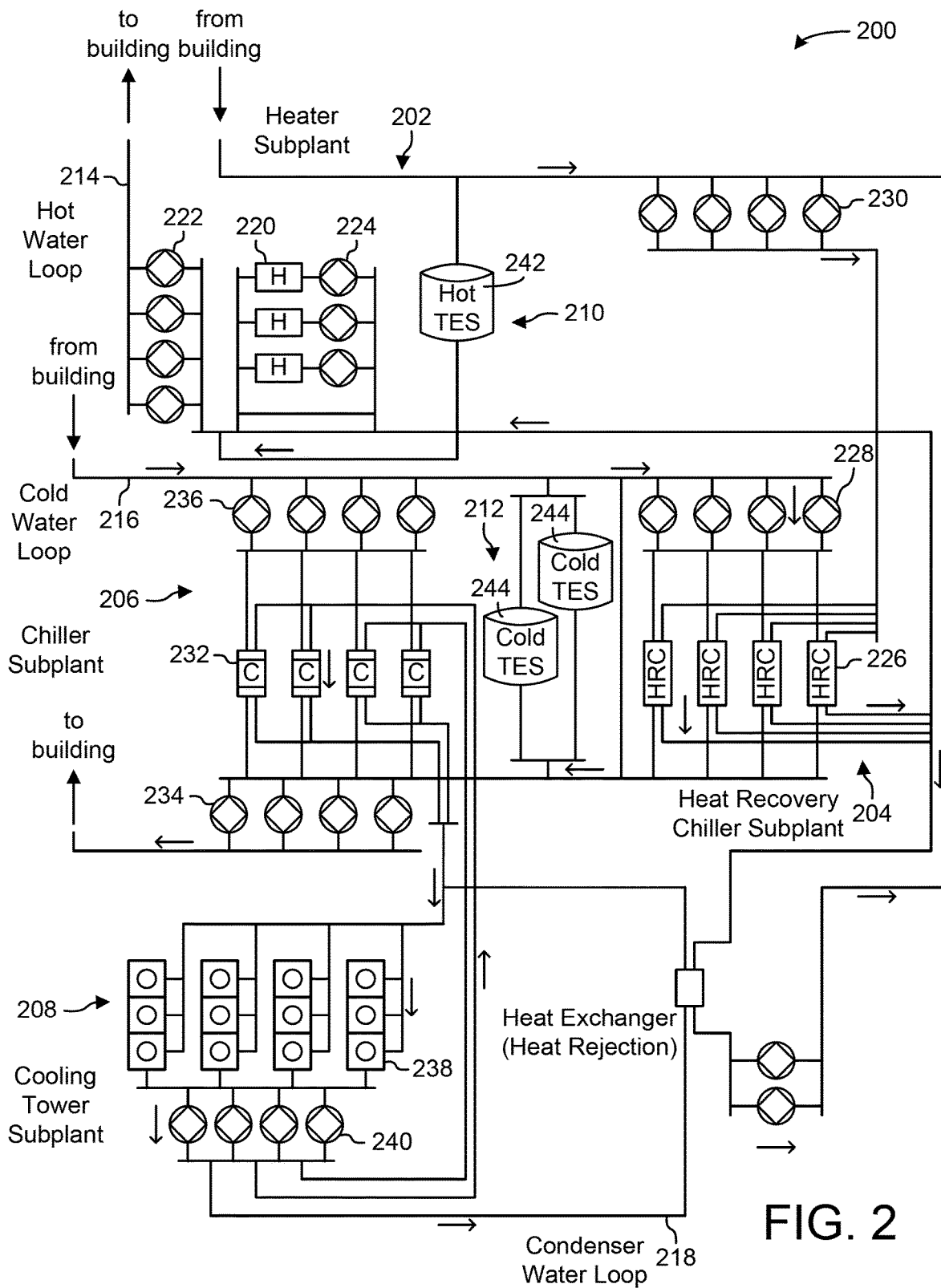
FIG. 2 is a block diagram of a central plant which can be used to serve the energy loads of the building of FIG. 1, according to an exemplary embodiment.

Referring now to FIG. 2, a block diagram of a central plant 200 is shown, according to some embodiments. In various embodiments, central plant 200 can supplement or replace waterside system 120 in HVAC system 100 or can be implemented separate from HVAC system 100. When implemented in HVAC system 100, central plant 200 can include a subset of the HVAC devices in HVAC system 100 (e.g., boiler 104, chiller 102, pumps, valves, etc.) and may operate to supply a heated or chilled fluid to AHU 106. The HVAC devices of central plant 200 can be located within building 10 (e.g., as components of waterside system 120) or at an offsite location such as a central energy facility that serves multiple buildings.

Central plant 200 is shown to include a plurality of subplants 202-208. Subplants 202-208 can be configured to convert energy or resource types (e.g., water, natural gas, electricity, etc.). For example, subplants 202-208 are shown to include a heater subplant 202, a heat recovery chiller subplant 204, a chiller subplant 206, and a cooling tower subplant 208. In some embodiments, subplants 202-208 consume resources purchased from utilities to serve the energy loads (e.g., hot water, cold water, electricity, etc.) of a building or campus. For example, heater subplant 202 can be configured to heat water in a hot water loop 214 that circulates the hot water between heater subplant 202 and building 10. Similarly, chiller subplant 206 can be configured to chill water in a cold water loop 216 that circulates the cold water between chiller subplant 206 building 10.

Heat recovery chiller subplant 204 can be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. In various embodiments, central plant 200 can include an electricity subplant (e.g., one or more electric generators) configured to generate electricity or any other type of subplant configured to convert energy or resource types.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve thermal energy loads of building 10. The water then returns to subplants 202-208 to receive further heating or cooling.

Although subplants 202-208 are shown and described as heating and cooling water for circulation to a building, it is understood that any other type of working fluid (e.g., glycol, $CO_2$, etc.) can be used in place of or in addition to water to serve thermal energy loads. In other embodiments, subplants 202-208 may provide heating and/or cooling directly to the building or campus without requiring an intermediate heat transfer fluid. These and other variations to central plant 200 are within the teachings of the present disclosure.

Each of subplants 202-208 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

In some embodiments, one or more of the pumps in central plant 200 (e.g., pumps 222, 224, 228, 230, 234, 236, and/or 240) or pipelines in central plant 200 include an isolation valve associated therewith. Isolation valves can be integrated with the pumps or positioned upstream or downstream of the pumps to control the fluid flows in central plant 200. In various embodiments, central plant 200 can include more, fewer, or different types of devices and/or subplants based on the particular configuration of central plant 200 and the types of loads served by central plant 200.

Still referring to FIG. 2, central plant 200 is shown to include hot thermal energy storage (TES) 210 and cold thermal energy storage (TES) 212. Hot TES 210 and cold TES 212 can be configured to store hot and cold thermal energy for subsequent use. For example, hot TES 210 can include one or more hot water storage tanks 242 configured to store the hot water generated by heater subplant 202 or heat recovery chiller subplant 204. Hot TES 210 may also include one or more pumps or valves configured to control the flow rate of the hot water into or out of hot TES tank 242.

Similarly, cold TES 212 can include one or more cold water storage tanks 244 configured to store the cold water generated by chiller subplant 206 or heat recovery chiller subplant 204. Cold TES 212 may also include one or more pumps or valves configured to control the flow rate of the cold water into or out of cold TES tanks 244. In some embodiments, central plant 200 includes electrical energy storage (e.g., one or more batteries) or any other type of device configured to store resources. The stored resources can be purchased from utilities, generated by central plant 200, or otherwise obtained from any source.

Asset Allocation System

Figure 3:
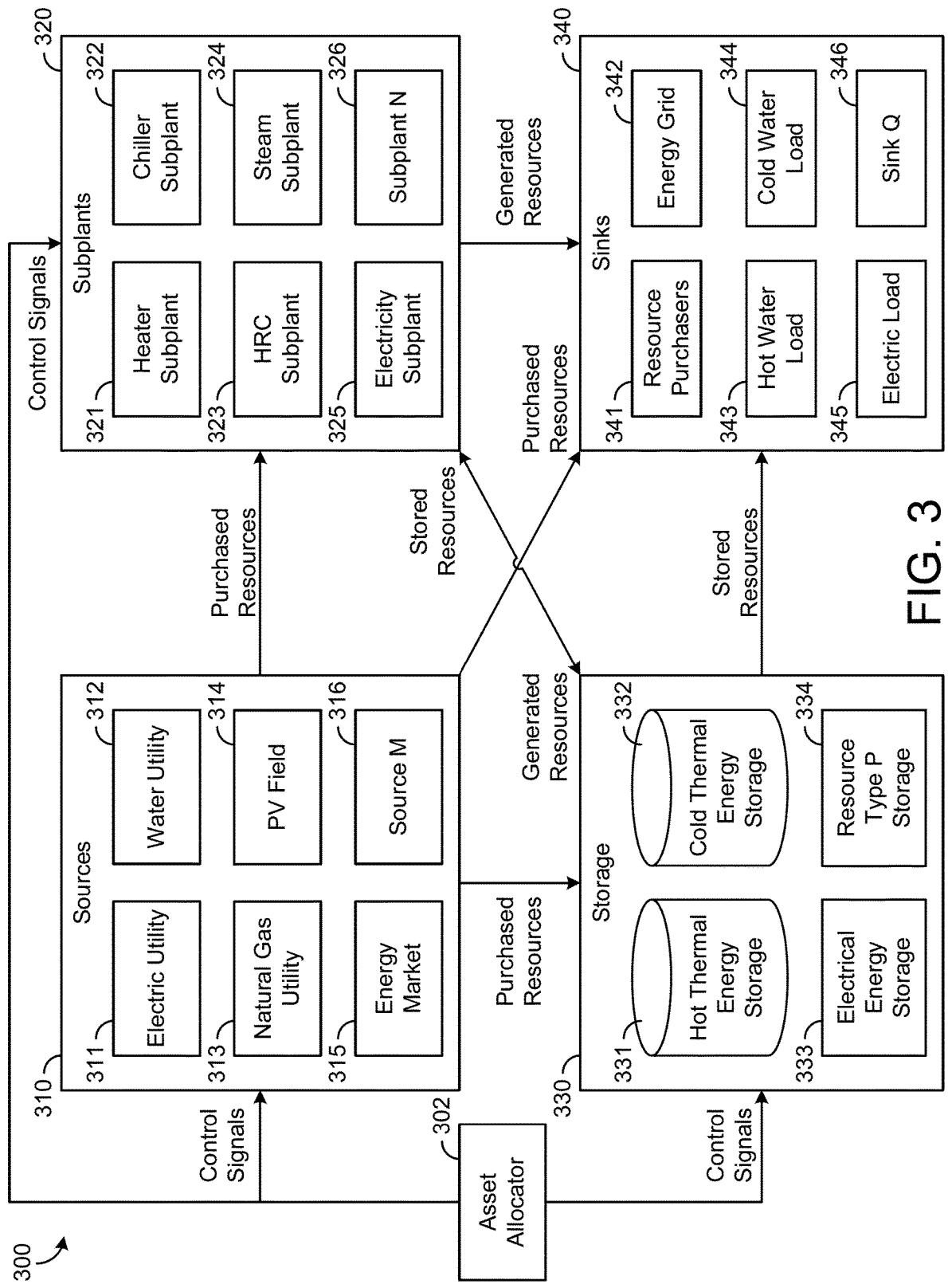
FIG. 3 is a block diagram of an asset allocation system including sources, subplants, storage, sinks, and an asset allocator configured to optimize the allocation of these assets, according to an exemplary embodiment.

Referring now to FIG. 3, a block diagram of an asset allocation system 300 is shown, according to an exemplary embodiment. Asset allocation system 300 can be configured to manage energy assets such as central plant equipment, battery storage, and other types of equipment configured to serve the energy loads of a building. Asset allocation system 300 can determine an optimal distribution of heating, cooling, electricity, and energy loads across different subplants (i.e., equipment groups) capable of producing that type of energy. In some embodiments, asset allocation system 300 is implemented as a component of central plant 200 and interacts with the equipment of central plant 200 in an online operational environment (e.g., performing real-time control of the central plant equipment).

Asset allocation system 300 is shown to include sources 310, subplants 320, storage 330, and sinks 340. These four categories of objects define the assets of a central plant and their interaction with the outside world. Sources 310 may include commodity markets or other suppliers from which resources such as electricity, water, natural gas, and other resources can be purchased or obtained. Sources 310 may provide resources that can be used by asset allocation system 300 to satisfy the demand of a building or campus. For example, sources 310 are shown to include an electric utility 311, a water utility 312, a natural gas utility 313, a photovoltaic (PV) field 314 (e.g., a collection of solar panels), an energy market 315, and source M 316, where M is the total number of sources 310. Resources purchased from sources 310 can be used by subplants 320 to produce generated resources (e.g., hot water, cold water, electricity, steam, etc.), stored in storage 330 for later use, or provided directly to sinks 340.

Subplants 320 are the main assets of a central plant. Subplants 320 are shown to include a heater subplant 321, a chiller subplant 322, a heat recovery chiller subplant 323, a steam subplant 324, an electricity subplant 325, and subplant N 326, where N is the total number of subplants 320. In some embodiments, subplants 320 include some or all of the subplants of central plant 200, as described with reference to FIG. 2. For example, subplants 320 can include heater subplant 202, heat recovery chiller subplant 204, chiller subplant 206, and/or cooling tower subplant 208.

Subplants 320 can be configured to convert resource types, making it possible to balance requested loads from the building or campus using resources purchased from sources 310. For example, heater subplant 321 may be configured to generate hot thermal energy (e.g., hot water) by heating water using electricity or natural gas. Chiller subplant 322 may be configured to generate cold thermal energy (e.g., cold water) by chilling water using electricity. Heat recovery chiller subplant 323 may be configured to generate hot thermal energy and cold thermal energy by removing heat from one water supply and adding the heat to another water supply. Steam subplant 324 may be configured to generate steam by boiling water using electricity or natural gas. Electricity subplant 325 may be configured to generate electricity using mechanical generators (e.g., a steam turbine, a gas-powered generator, etc.) or other types of electricity-generating equipment (e.g., photovoltaic equipment, hydroelectric equipment, etc.).

The input resources used by subplants 320 may be provided by sources 310, retrieved from storage 330, and/or generated by other subplants 320. For example, steam subplant 324 may produce steam as an output resource. Electricity subplant 325 may include a steam turbine that uses the steam generated by steam subplant 324 as an input resource to generate electricity. The output resources produced by subplants 320 may be stored in storage 330, provided to sinks 340, and/or used by other subplants 320. For example, the electricity generated by electricity subplant 325 may be stored in electrical energy storage 333, used by chiller subplant 322 to generate cold thermal energy, used to satisfy the electric load 345 of a building, or sold to resource purchasers 341.

Storage 330 can be configured to store energy or other types of resources for later use. Each type of storage within storage 330 may be configured to store a different type of resource. For example, storage 330 is shown to include hot thermal energy storage 331 (e.g., one or more hot water storage tanks), cold thermal energy storage 332 (e.g., one or more cold thermal energy storage tanks), electrical energy storage 333 (e.g., one or more batteries), and resource type P storage 334, where P is the total number of storage 330. In some embodiments, storage 330 include some or all of the storage of central plant 200, as described with reference to FIG. 2. In some embodiments, storage 330 includes the heat capacity of the building served by the central plant. The resources stored in storage 330 may be purchased directly from sources or generated by subplants 320.

In some embodiments, storage 330 is used by asset allocation system 300 to take advantage of price-based demand response (PBDR) programs. PBDR programs encourage consumers to reduce consumption when generation, transmission, and distribution costs are high. PBDR programs are typically implemented (e.g., by sources 310) in the form of energy prices that vary as a function of time. For example, some utilities may increase the price per unit of electricity during peak usage hours to encourage customers to reduce electricity consumption during peak times. Some utilities also charge consumers a separate demand charge based on the maximum rate of electricity consumption at any time during a predetermined demand charge period.

Advantageously, storing energy and other types of resources in storage 330 allows for the resources to be purchased at times when the resources are relatively less expensive (e.g., during non-peak electricity hours) and stored for use at times when the resources are relatively more expensive (e.g., during peak electricity hours). Storing resources in storage 330 also allows the resource demand of the building or campus to be shifted in time. For example, resources can be purchased from sources 310 at times when the demand for heating or cooling is low and immediately converted into hot or cold thermal energy by subplants 320. The thermal energy can be stored in storage 330 and retrieved at times when the demand for heating or cooling is high. This allows asset allocation system 300 to smooth the resource demand of the building or campus and reduces the maximum required capacity of subplants 320. Smoothing the demand also asset allocation system 300 to reduce the peak electricity consumption, which results in a lower demand charge.

In some embodiments, storage 330 is used by asset allocation system 300 to take advantage of incentive-based demand response (IBDR) programs. IBDR programs provide incentives to customers who have the capability to store energy, generate energy, or curtail energy usage upon request. Incentives are typically provided in the form of monetary revenue paid by sources 310 or by an independent service operator (ISO). IBDR programs supplement traditional utility-owned generation, transmission, and distribution assets with additional options for modifying demand load curves. For example, stored energy can be sold to resource purchasers 341 or an energy grid 342 to supplement the energy generated by sources 310. In some instances, incentives for participating in an IBDR program vary based on how quickly a system can respond to a request to change power output/consumption. Faster responses may be compensated at a higher level. Advantageously, electrical energy storage 333 allows system 300 to quickly respond to a request for electric power by rapidly discharging stored electrical energy to energy grid 342.

Sinks 340 may include the requested loads of a building or campus as well as other types of resource consumers. For example, sinks 340 are shown to include resource purchasers 341, an energy grid 342, a hot water load 343, a cold water load 344, an electric load 345, and sink Q 346, where Q is the total number of sinks 340. A building may consume various resources including, for example, hot thermal energy (e.g., hot water), cold thermal energy (e.g., cold water), and/or electrical energy. In some embodiments, the resources are consumed by equipment or subsystems within the building (e.g., HVAC equipment, lighting, computers and other electronics, etc.). The consumption of each sink 340 over the optimization period can be supplied as an input to asset allocation system 300 or predicted by asset allocation system 300. Sinks 340 can receive resources directly from sources 310, from subplants 320, and/or from storage 330.

Still referring to FIG. 3, asset allocation system 300 is shown to include an asset allocator 302. Asset allocator 302 may be configured to control the distribution, production, storage, and usage of resources in asset allocation system 300. In some embodiments, asset allocator 302 performs an optimization process determine an optimal set of control decisions for each time step within an optimization period. The control decisions may include, for example, an optimal amount of each resource to purchase from sources 310, an optimal amount of each resource to produce or convert using subplants 320, an optimal amount of each resource to store or remove from storage 330, an optimal amount of each resource to sell to resources purchasers 341 or energy grid 340, and/or an optimal amount of each resource to provide to other sinks 340. In some embodiments, the control decisions include an optimal amount of each input resource and output resource for each of subplants 320.

In some embodiments, asset allocator 302 is configured to optimally dispatch all campus energy assets in order to meet the requested heating, cooling, and electrical loads of the campus for each time step within an optimization horizon or optimization period of duration h. Instead of focusing on only the typical HVAC energy loads, the concept is extended to the concept of resource. Throughout this disclosure, the term "resource" is used to describe any type of commodity purchased from sources 310, used or produced by subplants 320, stored or discharged by storage 330, or consumed by sinks 340. For example, water may be considered a resource that is consumed by chillers, heaters, or cooling towers during operation. This general concept of a resource can be extended to chemical processing plants where one of the resources is the product that is being produced by the chemical processing plat.

Asset allocator 302 can be configured to operate the equipment of asset allocation system 300 to ensure that a resource balance is maintained at each time step of the optimization period. This resource balance is shown in the following equation:

$$\Sigma x_{time} = 0 \ \forall \text{resources}, \text{time} \in \text{horizon}$$

where the sum is taken over all producers and consumers of a given resource (i.e., all of sources 310, subplants 320, storage 330, and sinks 340) and time is the time index. Each time element represents a period of time during which the resource productions, requests, purchases, etc. are assumed constant. Asset allocator 302 may ensure that this equation is satisfied for all resources regardless of whether that resource is required by the building or campus. For example, some of the resources produced by subplants 320 may be intermediate resources that function only as inputs to other subplants 320.

In some embodiments, the resources balanced by asset allocator 302 include multiple resources of the same type (e.g., multiple chilled water resources, multiple electricity resources, etc.). Defining multiple resources of the same type may allow asset allocator 302 to satisfy the resource balance given the physical constraints and connections of the central plant equipment. For example, suppose a central plant has multiple chillers and multiple cold water storage tanks, with each chiller physically connected to a different cold water storage tank (i.e., chiller A is connected to cold water storage tank A, chiller B is connected to cold water storage tank B, etc.). Given that only one chiller can supply cold water to each cold water storage tank, a different cold water resource can be defined for the output of each chiller. This allows asset allocator 302 to ensure that the resource balance is satisfied for each cold water resource without attempting to allocate resources in a way that is physically impossible (e.g., storing the output of chiller A in cold water storage tank B, etc.).

Asset allocator 302 may be configured to minimize the economic cost (or maximize the economic value) of operating asset allocation system 300 over the duration of the optimization period. The economic cost may be defined by a cost function J(x) that expresses economic cost as a function of the control decisions made by asset allocator 302. The cost function J(x) may account for the cost of resources purchased from sources 310, as well as the revenue generated by selling resources to resource purchasers 341 or energy grid 342 or participating in incentive programs. The cost optimization performed by asset allocator 302 can be expressed as:

$$\arg\min_{x} J(x)$$

where J(x) is defined as follows:

$$J(x) = \sum_{sources} \sum_{horizon} \text{cost}(\text{purchase}_{resource,time}, \text{time}) - \sum_{incentives} \sum_{horizon} \text{revenue}(ReservationAmount)$$

The first term in the cost function J(x) represents the total cost of all resources purchased over the optimization horizon. Resources can include, for example, water, electricity, natural gas, or other types of resources purchased from a utility or other source 310. The second term in the cost function J(x) represents the total revenue generated by participating in incentive programs (e.g., IBDR programs) over the optimization horizon. The revenue may be based on the amount of power reserved for participating in the incentive programs. Accordingly, the total cost function represents the total cost of resources purchased minus any revenue generated from participating in incentive programs.

Each of subplants 320 and storage 330 may include equipment that can be controlled by asset allocator 302 to optimize the performance of asset allocation system 300. Subplant equipment may include, for example, heating devices, chillers, heat recovery heat exchangers, cooling towers, energy storage devices, pumps, valves, and/or other devices of subplants 320 and storage 330. Individual devices of subplants 320 can be turned on or off to adjust the resource production of each subplant 320. In some embodiments, individual devices of subplants 320 can be operated at variable capacities (e.g., operating a chiller at 10% capacity or 60% capacity) according to an operating setpoint received from asset allocator 302. Asset allocator 302 can control the equipment of subplants 320 and storage 330 to adjust the amount of each resource purchased, consumed, and/or produced by system 300.

In some embodiments, asset allocator 302 optimizes the cost function J(x) subject to the following constraint, which guarantees the balance between resources purchased, produced, discharged, consumed, and requested over the optimization horizon:

$$\sum_{sources} \text{purchase}_{resource,time} + \\ \sum_{subplants} \text{produces}(x_{internal,time}, x_{external,time}, v_{uncontrolled,time}) - \\ \sum_{subplants} \text{consumes}(x_{internal,time}, x_{external,time}, v_{uncontrolled,time}) + \\ \sum_{storages} \text{discharges}_{resource}(x_{internal,time}, x_{external,time}) - \sum_{sinks} \text{request}_{resource} = \\ 0 \ \forall \text{ resources}, \forall \text{ time} \in \text{horizon}$$

where $x_{internal,time}$ includes internal decision variables (e.g., load allocated to each component of asset allocation system 300), $x_{external,time}$ includes external decision variables (e.g., condenser water return temperature or other shared variables across subplants 320), and $v_{uncontrolled,time}$ includes uncontrolled variables (e.g., weather conditions).

The first term in the previous equation represents the total amount of each resource (e.g., electricity, water, natural gas, etc.) purchased from each source 310 over the optimization horizon. The second and third terms represent the total production and consumption of each resource by subplants 320 over the optimization horizon. The fourth term represents the total amount of each resource discharged from storage 330 over the optimization horizon. Positive values indicate that the resource is discharged from storage 330, whereas negative values indicate that the resource is charged or stored. The fifth term represents the total amount of each resource requested by sinks 340 over the optimization horizon. Accordingly, this constraint ensures that the total amount of each resource purchased, produced, or discharged from storage 330 is equal to the amount of each resource consumed, stored, or provided to sinks 340.

In some embodiments, additional constraints exist on the regions in which subplants 320 can operate. Examples of such additional constraints include the acceptable space (i.e., the feasible region) for the decision variables given the uncontrolled conditions, the maximum amount of a resource that can be purchased from a given source 310, and any number of plant-specific constraints that result from the mechanical design of the plant.

Asset allocator 302 may include a variety of features that enable the application of asset allocator 302 to nearly any central plant, central energy facility, combined heating and cooling facility, or combined heat and power facility. These features include broadly applicable definitions for subplants 320, sinks 340, storage 330, and sources 310; multiples of the same type of subplant 320 or sink 340; subplant resource connections that describe which subplants 320 can send resources to which sinks 340 and at what efficiency; subplant minimum turndown into the asset allocation optimization; treating electrical energy as any other resource that must be balanced; constraints that can be commissioned during runtime; different levels of accuracy at different points in the horizon; setpoints (or other decisions) that are shared between multiple subplants included in the decision vector; disjoint subplant operation regions; incentive based electrical energy programs; and high-level airside models. Incorporation of these features may allow asset allocator 302 to support a majority of the central energy facilities that will be seen in the future. Additionally, it will be possible to rapidly adapt to the inclusion of new subplant types. Some of these features are described in greater detail below.

Broadly applicable definitions for subplants 320, sinks 340, storage 330, and sources 310 allow each of these components to be described by the mapping from decision variables to resources consume and resources produced. Resources and other components of system 300 do not need to be "typed," but rather can be defined generally. The mapping from decision variables to resource consumption and production can change based on extrinsic conditions. Asset allocator 302 can solve the optimization problem by simply balancing resource use and can be configured to solve in terms of consumed resource 1, consumed resource 2, produced resource 1, etc., rather than electricity consumed, water consumed, and chilled water produced. Such an interface at the high-level allows for the mappings to be injected into asset allocation system 300 rather than needing them hard coded. Of course, "typed" resources and other components of system 300 can still exist in order to generate the mapping at run time, based on equipment out of service.

In some instances, constraints arise due to mechanical problems after an energy facility has been built. Accordingly, these constraints are site specific and are often not incorporated into the main code for any of subplants 320 or the high-level problem itself. Commissioned constraints allow for such constraints to be added without software updates during the commissioning phase of the project. Furthermore, if these additional constraints are known prior to the plant build, they can be added to the design tool run. This would allow the user to determine the cost of making certain design decisions.

Central Plant Controller

Figure 4:
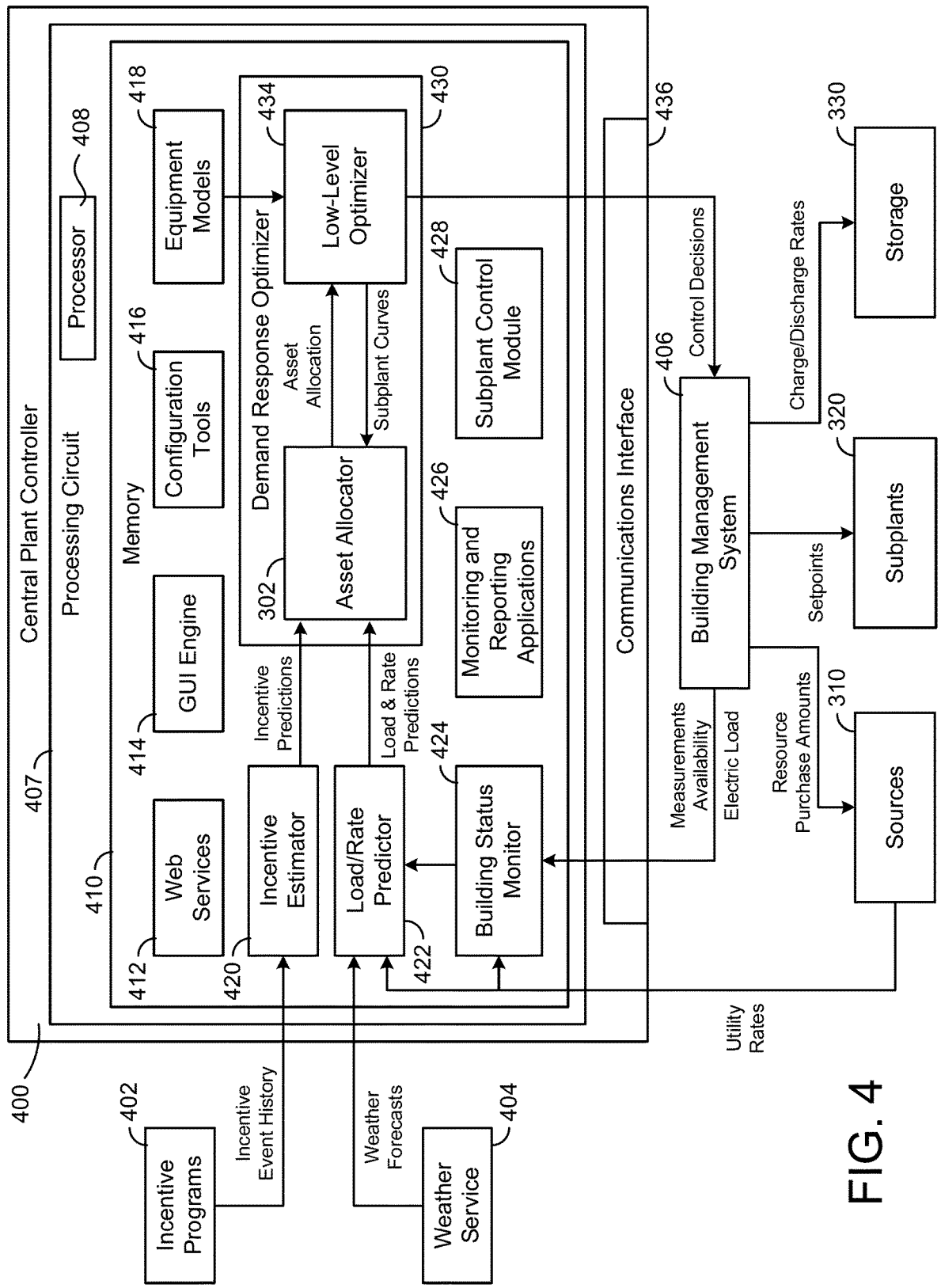
FIG. 4 is a block diagram of a central plant controller in which the asset allocator of FIG. 4 can be implemented, according to an exemplary embodiment.

Referring now to FIG. 4, a block diagram of a central plant controller 400 in which asset allocator 302 can be implemented is shown, according to an exemplary embodiment. In various embodiments, central plant controller 400 can be configured to monitor and control central plant 200, asset allocation system 300, and various components thereof (e.g., sources 310, subplants 320, storage 330, sinks 340, etc.). Central plant controller 400 is shown providing control decisions to a building management system (BMS) 406. The control decisions provided to BMS 406 may include resource purchase amounts for sources 310, setpoints for subplants 320, and/or charge/discharge rates for storage 330.

In some embodiments, BMS 406 is the same or similar to the BMS described with reference to FIG. 1. BMS 406 may be configured to monitor conditions within a controlled building or building zone. For example, BMS 406 may receive input from various sensors (e.g., temperature sensors, humidity sensors, airflow sensors, voltage sensors, etc.) distributed throughout the building and may report building conditions to central plant controller 400. Building conditions may include, for example, a temperature of the building or a zone of the building, a power consumption (e.g., electric load) of the building, a state of one or more actuators configured to affect a controlled state within the building, or other types of information relating to the controlled building. BMS 406 may operate subplants 320 and storage 330 to affect the monitored conditions within the building and to serve the thermal energy loads of the building.

BMS 406 may receive control signals from central plant controller 400 specifying on/off states, charge/discharge rates, and/or setpoints for the subplant equipment. BMS 406 may control the equipment (e.g., via actuators, power relays, etc.) in accordance with the control signals provided by central plant controller 400. For example, BMS 406 may operate the equipment using closed loop control to achieve the setpoints specified by central plant controller 400. In various embodiments, BMS 406 may be combined with central plant controller 400 or may be part of a separate building management system. According to an exemplary embodiment, BMS 406 is a METASYS® brand building management system, as sold by Johnson Controls, Inc.

Central plant controller 400 may monitor the status of the controlled building using information received from BMS 406. Central plant controller 400 may be configured to predict the thermal energy loads (e.g., heating loads, cooling loads, etc.) of the building for plurality of time steps in an optimization period (e.g., using weather forecasts from a weather service 404). Central plant controller 400 may also predict the revenue generation potential of incentive based demand response (IBDR) programs using an incentive event history (e.g., past clearing prices, mileage ratios, event probabilities, etc.) from an incentive programs 402. Central plant controller 400 may generate control decisions that optimize the economic value of operating central plant 200 over the duration of the optimization period subject to constraints on the optimization process (e.g., energy balance constraints, load satisfaction constraints, etc.). The optimization process performed by central plant controller 400 is described in greater detail below.

In some embodiments, central plant controller 400 is integrated within a single computer (e.g., one server, one housing, etc.). In various other exemplary embodiments, central plant controller 400 can be distributed across multiple servers or computers (e.g., that can exist in distributed locations). In another exemplary embodiment, central plant controller 400 may be integrated with a smart building manager that manages multiple building systems and/or combined with BMS 406. Central plant controller 400 can be implemented in any of a variety of forms including, for example, a physical controller installed on-site within a building, a supervisory control system (e.g., a building management system) located on-site or off-site (e.g., a cloud-hosted controller) and configured to communicate with a remote building or remote equipment via a communications network (e.g., the Internet), or any combination thereof.

Central plant controller 400 is shown to include a communications interface 436 and a processing circuit 407. Communications interface 436 may include wired or wireless interfaces (e.g., jacks, antennas, transmitters, receivers, transceivers, wire terminals, etc.) for conducting data communications with various systems, devices, or networks. For example, communications interface 436 may include an Ethernet card and port for sending and receiving data via an Ethernet-based communications network and/or a Wi-Fi transceiver for communicating via a wireless communications network. Communications interface 436 may be configured to communicate via local area networks or wide area networks (e.g., the Internet, a building WAN, etc.) and may use a variety of communications protocols (e.g., BACnet, IP, LON, etc.).

Communications interface 436 may be a network interface configured to facilitate electronic data communications between central plant controller 400 and various external systems or devices (e.g., BMS 406, subplants 320, storage 330, sources 310, etc.). For example, central plant controller 400 may receive information from BMS 406 indicating one or more measured states of the controlled building (e.g., temperature, humidity, electric loads, etc.) and one or more states of subplants 320 and/or storage 330 (e.g., equipment status, power consumption, equipment availability, etc.). Communications interface 436 may receive inputs from BMS 406, subplants 320, and/or storage 330 and may provide operating parameters (e.g., on/off decisions, setpoints, etc.) to subplants 320 and storage 330 via BMS 406. The operating parameters may cause subplants 320 and storage 330 to activate, deactivate, or adjust a setpoint for various devices thereof.

Still referring to FIG. 4, processing circuit 407 is shown to include a processor 408 and memory 410. Processor 408 may be a general purpose or specific purpose processor, an application specific integrated circuit (ASIC), one or more field programmable gate arrays (FPGAs), a group of processing components, or other suitable processing components. Processor 408 may be configured to execute computer code or instructions stored in memory 410 or received from other computer readable media (e.g., CDROM, network storage, a remote server, etc.).

Memory 410 may include one or more devices (e.g., memory units, memory devices, storage devices, etc.) for storing data and/or computer code for completing and/or facilitating the various processes described in the present disclosure. Memory 410 may include random access memory (RAM), read-only memory (ROM), hard drive storage, temporary storage, non-volatile memory, flash memory, optical memory, or any other suitable memory for storing software objects and/or computer instructions. Memory 410 may include database components, object code components, script components, or any other type of information structure for supporting the various activities and information structures described in the present disclosure. Memory 410 may be communicably connected to processor 408 via processing circuit 407 and may include computer code for executing (e.g., by processor 408) one or more processes described herein.

Memory 410 is shown to include a building status monitor 424. Central plant controller 400 may receive data regarding the overall building or building space to be heated or cooled by system 300 via building status monitor 424. In an exemplary embodiment, building status monitor 424 may include a graphical user interface component configured to provide graphical user interfaces to a user for selecting building requirements (e.g., overall temperature parameters, selecting schedules for the building, selecting different temperature levels for different building zones, etc.).

Central plant controller 400 may determine on/off configurations and operating setpoints to satisfy the building requirements received from building status monitor 424. In some embodiments, building status monitor 424 receives, collects, stores, and/or transmits cooling load requirements, building temperature setpoints, occupancy data, weather data, energy data, schedule data, and other building parameters. In some embodiments, building status monitor 424 stores data regarding energy costs, such as pricing information available from sources 310 (energy charge, demand charge, etc.).

Still referring to FIG. 4, memory 410 is shown to include a load/rate predictor 422. Load/rate predictor 422 may be configured to predict the thermal energy loads ($\hat{\ell}_k$) of the building or campus for each time step k (e.g., k=1 . . . n) of an optimization period. Load/rate predictor 422 is shown receiving weather forecasts from a weather service 404. In some embodiments, load/rate predictor 422 predicts the thermal energy loads $\hat{\ell}_k$ as a function of the weather forecasts. In some embodiments, load/rate predictor 422 uses feedback from BMS 406 to predict loads $\hat{\ell}_k$. Feedback from BMS 406 may include various types of sensory inputs (e.g., temperature, flow, humidity, enthalpy, etc.) or other data relating to the controlled building (e.g., inputs from a HVAC system, a lighting control system, a security system, a water system, etc.).

Still referring to FIG. 4, memory 410 is shown to include an incentive estimator 420. Incentive estimator 420 may be configured to estimate the revenue generation potential of participating in various incentive-based demand response (IBDR) programs. In some embodiments, incentive estimator 420 receives an incentive event history from incentive programs 402. The incentive event history may include a history of past IBDR events from incentive programs 402. An IBDR event may include an invitation from incentive programs 402 to participate in an IBDR program in exchange for a monetary incentive. The incentive event history may indicate the times at which the past IBDR events occurred and attributes describing the IBDR events (e.g., clearing prices, mileage ratios, participation requirements, etc.). Incentive estimator 420 may use the incentive event history to estimate IBDR event probabilities during the optimization period.

Incentive estimator 420 is shown providing incentive predictions to a demand response optimizer 430. The incentive predictions may include the estimated IBDR probabilities, estimated participation requirements, an estimated amount of revenue from participating in the estimated IBDR events, and/or any other attributes of the predicted IBDR events. Demand response optimizer 430 may use the incentive predictions along with the predicted loads $\hat{\ell}_k$ and utility rates from load/rate predictor 422 to determine an optimal set of control decisions for each time step within the optimization period.

Still referring to FIG. 4, memory 410 is shown to include a demand response optimizer 430. Demand response optimizer 430 may perform a cascaded optimization process to optimize the performance of asset allocation system 300. For example, demand response optimizer 430 is shown to include asset allocator 302 and a low-level optimizer 434. Asset allocator 302 may control an outer (e.g., subplant level) loop of the cascaded optimization. Asset allocator 302 may determine an optimal set of control decisions for each time step in the prediction window in order to optimize (e.g., maximize) the value of operating asset allocation system 300. Control decisions made by asset allocator 302 may include, for example, load setpoints for each of subplants 320, charge/discharge rates for each of storage 330, and resource purchase amounts for each type of resource purchased from sources 310. In other words, the control decisions may define resource allocation at each time step. The control decisions made by asset allocator 302 are based on the statistical estimates of incentive event probabilities and revenue generation potential for various IBDR events as well as the load and rate predictions.

Low-level optimizer 434 may control an inner (e.g., equipment level) loop of the cascaded optimization. Low-level optimizer 434 may determine how to best run each subplant at the load setpoint determined by asset allocator 302. For example, low-level optimizer 434 may determine on/off states and/or operating setpoints for various devices of the subplant equipment in order to optimize (e.g., minimize) the energy consumption of each subplant while meeting the resource allocation setpoint for the subplant. In some embodiments, low-level optimizer 434 receives actual incentive events from incentive programs 402. Low-level optimizer 434 may determine whether to participate in the incentive events based on the resource allocation set by asset allocator 302. For example, if insufficient resources have been allocated to a particular IBDR program by asset allocator 302 or if the allocated resources have already been used, low-level optimizer 434 may determine that asset allocation system 300 will not participate in the IBDR program and may ignore the IBDR event. However, if the required resources have been allocated to the IBDR program and are available in storage 330, low-level optimizer 434 may determine that system 300 will participate in the IBDR program in response to the IBDR event. The cascaded optimization process performed by demand response optimizer 630 is described in greater detail in U.S. patent application Ser. No. 15/247,885, the entire disclosure of which is incorporated by reference herein.

In some embodiments, low-level optimizer 434 generates and provides subplant curves to asset allocator 302. Each subplant curve may indicate an amount of resource consumption by a particular subplant (e.g., electricity use measured in kW, water use measured in L/s, etc.) as a function of the subplant load. In some embodiments, low-level optimizer 434 generates the subplant curves by running the low-level optimization process for various combinations of subplant loads and weather conditions to generate multiple data points. Low-level optimizer 434 may fit a curve to the data points to generate the subplant curves. In other embodiments, low-level optimizer 434 provides the data points asset allocator 302 and asset allocator 302 generates the subplant curves using the data points. Asset allocator 302 may store the subplant curves in memory for use in the high-level (i.e., asset allocation) optimization process.

Still referring to FIG. 4, memory 410 is shown to include a subplant control module 428. Subplant control module 428 may store historical data regarding past operating statuses, past operating setpoints, and instructions for calculating and/or implementing control parameters for subplants 320 and storage 330. Subplant control module 428 may also receive, store, and/or transmit data regarding the conditions of individual devices of the subplant equipment, such as operating efficiency, equipment degradation, a date since last service, a lifespan parameter, a condition grade, or other device-specific data. Subplant control module 428 may receive data from subplants 320, storage 330, and/or BMS 406 via communications interface 436. Subplant control module 428 may also receive and store on/off statuses and operating setpoints from low-level optimizer 434.

Data and processing results from demand response optimizer 430, subplant control module 428, or other modules of central plant controller 400 may be accessed by (or pushed to) monitoring and reporting applications 426. Monitoring and reporting applications 426 may be configured to generate real time "system health" dashboards that can be viewed and navigated by a user (e.g., a system engineer). For example, monitoring and reporting applications 426 may include a web-based monitoring application with several graphical user interface (GUI) elements (e.g., widgets, dashboard controls, windows, etc.) for displaying key performance indicators (KPI) or other information to users of a GUI. In addition, the GUI elements may summarize relative energy use and intensity across energy storage systems in different buildings (real or modeled), different campuses, or the like. Other GUI elements or reports may be generated and shown based on available data that allow users to assess performance across one or more energy storage systems from one screen. The user interface or report (or underlying data engine) may be configured to aggregate and categorize operating conditions by building, building type, equipment type, and the like. The GUI elements may include charts or histograms that allow the user to visually analyze the operating parameters and power consumption for the devices of the energy storage system.

Still referring to FIG. 4, central plant controller 400 may include one or more GUI servers, web services 412, or GUI engines 414 to support monitoring and reporting applications 426. In various embodiments, applications 426, web services 412, and GUI engine 414 may be provided as separate components outside of central plant controller 400 (e.g., as part of a smart building manager). Central plant controller 400 may be configured to maintain detailed historical databases (e.g., relational databases, XML databases, etc.) of relevant data and includes computer code modules that continuously, frequently, or infrequently query, aggregate, transform, search, or otherwise process the data maintained in the detailed databases. Central plant controller 400 may be configured to provide the results of any such processing to other databases, tables, XML files, or other data structures for further querying, calculation, or access by, for example, external monitoring and reporting applications.

Central plant controller 400 is shown to include configuration tools 416. Configuration tools 416 can allow a user to define (e.g., via graphical user interfaces, via prompt-driven "wizards," etc.) how central plant controller 400 should react to changing conditions in the energy storage subsystems. In an exemplary embodiment, configuration tools 416 allow a user to build and store condition-response scenarios that can cross multiple energy storage system devices, multiple building systems, and multiple enterprise control applications (e.g., work order management system applications, entity resource planning applications, etc.). For example, configuration tools 416 can provide the user with the ability to combine data (e.g., from subsystems, from event histories) using a variety of conditional logic. In varying exemplary embodiments, the conditional logic can range from simple logical operators between conditions (e.g., AND, OR, XOR, etc.) to pseudo-code constructs or complex programming language functions (allowing for more complex interactions, conditional statements, loops, etc.). Configuration tools 416 can present user interfaces for building such conditional logic. The user interfaces may allow users to define policies and responses graphically. In some embodiments, the user interfaces may allow a user to select a pre-stored or pre-constructed policy and adapt it or enable it for use with their system.

Asset Allocator Components

Figure 5:
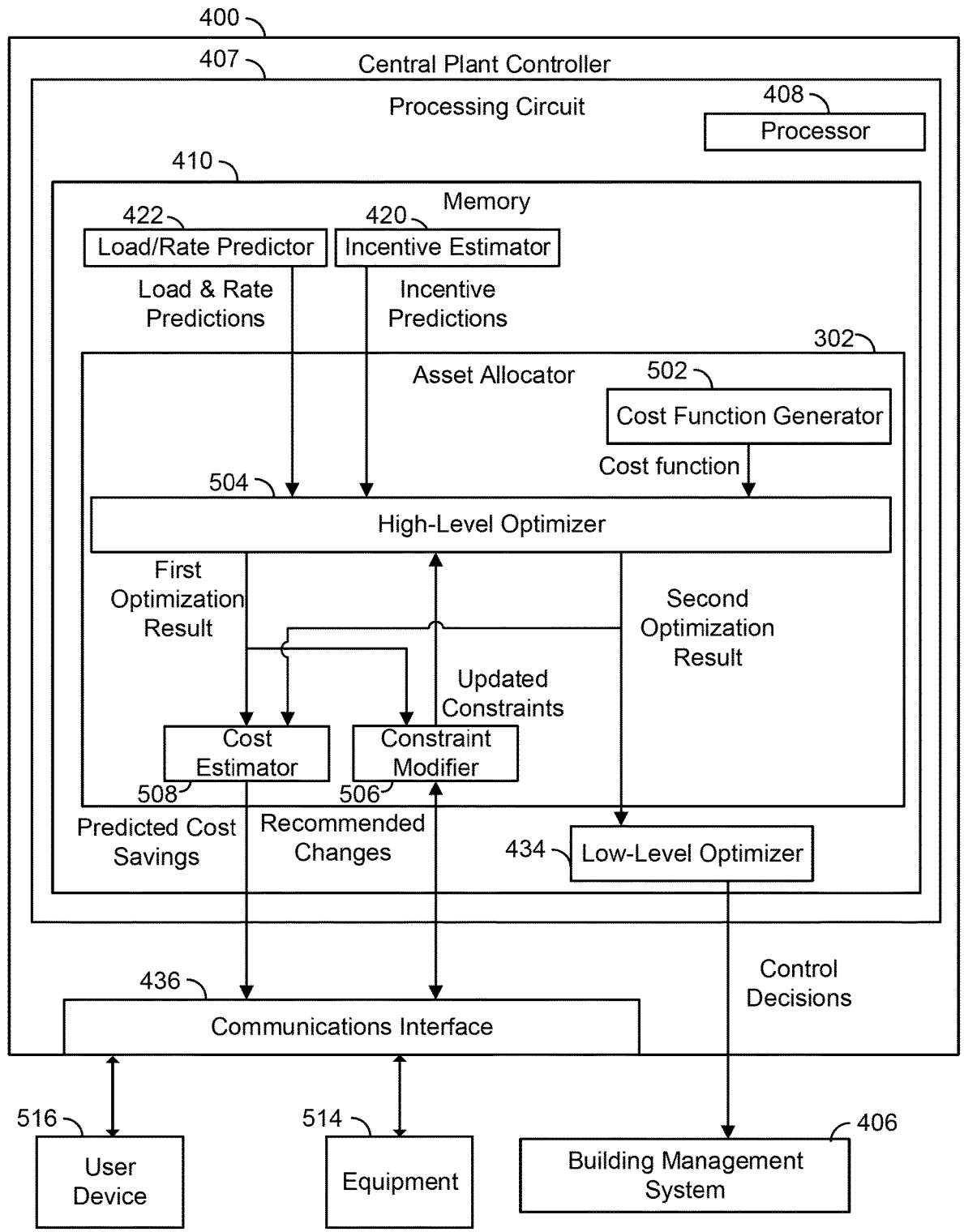
FIG. 5 is a block diagram of the asset allocator included in the central plant of FIG. 4, according to an exemplary embodiment.

Referring now to FIG. 5, a detailed view of components included in asset allocator 302 as implemented in the central plant controller 400 is shown, according to an exemplary embodiment. Asset allocator 302 is shown to include a cost function generator 502. Cost function generator 502 may be configured to generate a cost function J(x). As previously described, the cost function cost function J(x) may account for the cost of resources purchased from various sources, as well as the revenue generated by selling resources (e.g., to an energy grid) or participating in incentive programs. Additionally, the cost function J(x) may define a cost of operating central plant 200 over a time period. The cost function J(x) generated by cost function generator 502 is shown to be transmitted to high-level optimizer 504.

Although the cost function J(x) is described primarily as accounting for monetary cost, it is contemplated that the cost function J(x) could be modified or replaced with any type of cost function that accounts for one or more other control objectives (e.g., resource consumption, carbon emissions, occupant comfort, disease transmission risk, equipment degradation or reliability, etc.) in addition monetary cost or in place of monetary cost without departing from the teachings of the present disclosure. The terms "cost function" and "objective function" are used synonymously throughout the present disclosure and both refer to the function J(x) generated by cost function generator 502, regardless of whether the function J(x) accounts for monetary cost and/or other control objectives. Additionally, it should be understood that the "cost" defined by the cost function J(x) may be a monetary cost (e.g., expressed in units of dollars or other currency) and/or other types of cost such as resource consumption (e.g., expressed in units of energy, water, natural gas, or any other resource), carbon emissions (e.g., expressed in units of carbon), occupant comfort (e.g., expressed in units of comfort), disease transmission risk (e.g., expressed in units of risk or probability), and/or equipment reliability (e.g., expressed in units of reliability or expected failures). As such, it should be appreciated that references to "cost" throughout the present disclosure are not necessarily monetary cost, but may include any other control objectives which may be desirable to optimize. Several examples of cost functions J(x) that could be generated by cost function generator 502 to account for a variety of different control objectives are described below.

One example of a cost function J(x) that can be generated by cost function generator 502 is a monetary cost function such as:

$$J(x) = \sum_{r=1}^{p} \sum_{k=1}^{n} c_{r,k} * x_{r,k}$$

where $x_{r,k}$ is the amount of resource r purchased from sources 310 at time step k (e.g., kW or kWh of electricity, liters of water, therms or BTUs of natural gas, etc.), $c_{r,k}$ is the per unit cost of resource r purchased from sources 310 at time step k (e.g., $/kW, $/kWh, $/liter, $/therm, $/BTU, etc.), p is the total number of resources (e.g., electricity, natural gas, water, etc.), and n is the total number of time steps within the optimization horizon or optimization period. Accordingly, this example cost function J(x) expresses the cost in units of monetary cost (e.g., $) and sums the total cost of all resources (i.e., r=1 . . . p) purchased over all time steps (i.e., k=n) of the optimization period. The x variables are decision variables in the cost function J(x) whereas the c variables can be predicted or estimated beforehand and provided as inputs to the cost function J(x) by load/rate predictor 422 as previously described.

In some embodiments, the cost function J(x) can be modified to account for various other sources of monetary cost such as maintenance cost, equipment purchase or replacement cost (e.g., capital cost), equipment degradation cost, and/or any of the other sources of monetary cost described in U.S. patent application Ser. No. 15/895,836 filed Feb. 13, 2018, U.S. patent application Ser. No. 16/418,686 filed May 21, 2019, U.S. patent application Ser. No. 16/438,961 filed Jun. 12, 2019, U.S. patent application Ser. No. 16/449,198 filed Jun. 21, 2019, U.S. patent application Ser. No. 16/457,314 filed Jun. 28, 2019, U.S. patent application Ser. No. 16/697,099 filed Nov. 26, 2019, U.S. patent application Ser. No. 16/687,571 filed Nov. 18, 2019, U.S. patent application Ser. No. 16/518,548 filed Jul. 22, 2019, U.S. patent application Ser. No. 16/899,220 filed Jun. 11, 2020, U.S. patent application Ser. No. 16/943,781 filed Jul. 30, 2020, and/or U.S. patent application Ser. No. 17/017,028 filed Sep. 10, 2020. The entire disclosures of each of these patent applications are incorporated by reference herein. In some embodiments, the cost function generated by cost function generator 502 may include any of the cost functions or portions of the cost functions described in these patent applications.

In some embodiments, the cost function $J(x)$ can be modified to account for various sources of revenue such as revenue generated by participating in incentive-based demand response (IBDR) programs, revenue generated by selling resources back to sources 310, revenue generated by selling resources to resource purchasers 341 or to energy grid 342 (e.g., selling electricity previously purchased or generated by the system to electric utility 311, energy grid 342, or energy market 315), or any other sources of revenue that can be obtained by operating the subplants 320. The revenue generated may be an additional term of the cost function $J(x)$ which subtracts from the first term in the example cost function $J(x)$ shown above.

Another example of a cost function $J(x)$ that can be generated by cost function generator 502 is a resource consumption cost function such as:

$$J(x) = \sum_{r=1}^{p} \sum_{k=1}^{n} w_r * x_{r,k}$$

where $x_{r,k}$ is the amount of resource r consumed by subplants 320 or sinks 340 at time step k (e.g., kW or kWh of electricity, liters of water, therms of natural gas, etc.), $w_r$ is a weighting factor applied to resource r in order to covert each resource to common units (e.g., unit/kW, unit/kWh, unit/liter, unit/therm, etc.) and define the relative importance of each resource, p is the total number of resources (e.g., electricity, natural gas, water, etc.), and n is the total number of time steps within the optimization horizon or optimization period. Accordingly, this example cost function $J(x)$ expresses the cost in units of resource consumption and sums the total consumption of all resources (i.e., r=1 . . . p) over all time steps (i.e., k=1 . . . n) of the optimization period. The x variables are decision variables in the cost function $J(x)$ whereas the w variables can be provided as inputs to the cost function $J(x)$ to define the relative importance of each resource.

In some embodiments, resource production within the system (e.g., the output of a local PV field, resources produced by subplants 320, resources discharged from storage 330) is accounted for as negative resource consumption (i.e., negative values of the x variables) in the cost function $J(x)$. Conversely, resource consumption within the system (e.g., resources consumed by subplants 320, resources consumed by sinks 340, resources charged into storage 330) is accounted for as positive resource consumption (i.e. positive values of the x variables) in the cost function $J(x)$. In some embodiments, each value of $x_{r,k}$ in the cost function $J(x)$ represents the net resource consumption of a particular resource r at time step k by all components of the system. For example, the cost function $J(x)$ may be subject to a set of constraints that define $x_{r,k}$ as the sum of all sources of resource consumption of resource r at time step k minus the sum of all sources of resource production of resource r at time step k.

Another example of a cost function $J(x)$ that can be generated by cost function generator 502 is a carbon emissions cost function such as:

$$J(x) = \sum_{r=1}^{p} \sum_{k=1}^{n} \beta_{r,k} * x_{r,k}$$

where $x_{r,k}$ is the amount of resource r consumed by subplants 320 or sinks 340 at time step k (e.g., kW or kWh of electricity, liters of water, therms of natural gas, etc.), $\beta_{r,k}$ represents an amount of carbon emissions per unit of consumption or resource r at time step k (e.g., carbon emissions per kW, carbon emissions per kWh, carbon emissions per liter, carbon emissions per therm, etc.) in order to translate resource consumption into units of carbon emissions, p is the total number of resources (e.g., electricity, natural gas, water, etc.), and n is the total number of time steps within the optimization horizon or optimization period. Accordingly, this example cost function $J(x)$ expresses the cost in units of carbon emissions and sums the total carbon emissions resulting from consumption of all resources (i.e., r=1 . . . p) over all time steps (i.e., k=1 . . . n) of the optimization period. The x variables are decision variables in the cost function $J(x)$ whereas the β variables can be provided as inputs to the cost function $J(x)$ to define the relationship between carbon emissions and resource consumption for each resource.

In some embodiments, the β variables include marginal operating emissions rates (MOER) for resources purchased from sources 310 and/or other translation factors that translate between amounts of resource consumption and corresponding amounts of carbon emissions. Several examples of how MOER can be incorporated into a cost function as well as other examples of cost functions that account for carbon emissions or other sustainability metrics are described in detail in U.S. Provisional Patent Application No. 63/194,771 filed May 28, 2021, U.S. Provisional Patent Application No. 63/220,878 filed Jul. 12, 2021, U.S. Provisional Patent Application No. 63/246,177 filed Sep. 20, 2021, and U.S. patent application Ser. No. 17/483,078 filed Sep. 23, 2021. The entire disclosures of each of these patent applications are incorporated by reference herein. In some embodiments, the cost function generated by cost function generator 502 may include any of the cost functions or portions of the cost functions described in these patent applications.

Another example of a cost function $J(x)$ that can be generated by cost function generator 502 is an occupant comfort cost function such as:

$$J(x) = \sum_{l=1}^{m} \sum_{k=1}^{n} w_{l,k} * x_{comfort_{l,k}}$$

where $x_{comfort_{l,k}}$ represents occupant comfort within building zone l at time step k, $w_{l,k}$ is a weight that represents the relative importance of occupant comfort within building zone l at time step k, m is the total number of building zones, and n is the total number of time steps in the optimization period or optimization horizon. Accordingly, this example cost function J(x) expresses the cost in units of occupant comfort and sums the total occupant comfort over all building zones (i.e., l=1 ... m) over all time steps (i.e., k=1 ... n) of the optimization period. The weights $w_{l,k}$ can be set to prioritize occupant comfort in some building zones over others (e.g., based on whether the building zone is occupied or unoccupied, based on the identity of the occupants, etc.) and/or to prioritize occupant comfort at certain times of day over other times of day (e.g., prioritize occupant comfort during business hours). In some embodiments, the weights $w_{l,k}$ are provided as inputs to the cost function J(x), whereas the occupant comfort variables $x_{comfort_{l,k}}$ are decision variables in the cost function J(x).

In some embodiments, occupant comfort $x_{comfort_{l,k}}$ can be defined objectively based on the amount that a measured or predicted building condition (e.g., temperature, humidity, airflow, etc.) within the corresponding building zone l deviates from a comfort setpoint or comfort range at time step k. If multiple different building conditions are considered, the occupant comfort $x_{comfort_{l,k}}$ can be defined as a summation or weighted combination of the deviations of the various building conditions relative to their corresponding setpoints or ranges. An exemplary method for predicting occupant comfort based on building conditions is described in U.S. patent application Ser. No. 16/943,955 filed Jul. 30, 2020, the entire disclosure of which is incorporated by reference herein. In some embodiments, occupant comfort $x_{comfort_{l,k}}$ can be quantified based on detected or predicted occupant overrides of temperature setpoints and/or based on predicted mean vote calculations. These and other methods for quantifying occupant comfort are described in U.S. patent application Ser. No. 16/405,724 filed May 7, 2019, U.S. patent application Ser. No. 16/703,514 filed Dec. 4, 2019, and U.S. patent application Ser. No. 16/516,076 filed Jul. 18, 2019, each of which is incorporated by reference herein in its entirety.

Another example of a cost function J(x) that can be generated by cost function generator 502 is a disease transmission or infection risk cost function such as:

$$J(x) = \sum_{l=1}^{m} \sum_{k=1}^{n} w_{l,k} * x_{infection_{l,k}}$$

where $x_{infection_{l,k}}$ represents the risk of infection or disease transmission (e.g., infection probability) within building zone l at time step k, $w_{l,k}$ is a weight that represents the relative importance of the risk of infection or disease transmission within building zone l at time step k, m is the total number of building zones, and n is the total number of time steps in the optimization period or optimization horizon. Accordingly, this example cost function J(x) expresses the cost in units of the risk of infection or disease transmission and sums the total risk of infection or disease transmission over all building zones (i.e., l=1 ... m) over all time steps (i.e., k=1 ... n) of the optimization period. The weights $w_{l,k}$ can be set to prioritize the risk of infection or disease transmission in some building zones over others (e.g., based on whether the building zone is occupied or unoccupied, based on the health status of the occupants, etc.) and/or to prioritize the risk of infection or disease transmission at certain times of day over other times of day (e.g., prioritize times that occur during business hours or hours of expected occupancy). In some embodiments, the weights $w_{l,k}$ are provided as inputs to the cost function J(x), whereas the occupant comfort variables $x_{comfort_{l,k}}$ are decision variables in the cost function J(x).

In some embodiments, the infection risk $x_{infection_{l,k}}$ is predicted using a dynamic model that defines infection risk within a building zone as a function of control decisions for that zone (e.g., ventilation rate, air filtration actions, etc.) as well as other variables such as the number of infectious individuals within the building zone, the size of the building zone, the occupants' breathing rate, etc. For example, the Wells-Riley equation can be used to quantify the infection risk $x_{infection_{l,k}}$ of airborne transmissible diseases. In some embodiments, the infection risk $x_{infection_{l,k}}$ can be predicted as a function of a concentration of infectious quanta within the building zone, which can in turn be predicted using a dynamic infectious quanta model. Several examples of how infection risk and infectious quanta can be predicted as a function of control decisions for a zone are described in detail in U.S. Provisional Patent Application No. 62/873,631 filed Jul. 12, 2019, U.S. patent application Ser. No. 16/927,318 filed Jul. 13, 2020, U.S. patent application Ser. No. 16/927,759 filed Jul. 13, 2020, U.S. patent application Ser. No. 16/927,766 filed Jul. 13, 2020, U.S. patent application Ser. No. 17/459,963 filed Aug. 27, 2021, and U.S. patent application Ser. No. 17/393,138 filed Aug. 3, 2021. The entire disclosures of each of these patent applications are incorporated by reference herein. In some embodiments, the cost function J(x) generated by cost function generator 502 and/or the predictive models or constraints used in combination with the cost function J(x) may include any of the cost functions, predictive models, or constraints described in any of these patent applications.

Another example of a cost function J(x) that can be generated by cost function generator 502 is a reliability cost function such as:

$$J(x) = \sum_{d=1}^{v} \sum_{k=1}^{n} w_{d,k} * x_{reliability_{d,k}}$$

where $x_{reliability_{d,k}}$ represents the reliability of device d of the set of building equipment (e.g., devices of subplants 320, storage 330, etc.) at time step k, $w_{d,k}$ is a weight that represents the relative importance of device d at time step k, v is the total number of devices, and n is the total number of time steps in the optimization period or optimization horizon. Accordingly, this example cost function J(x) expresses the cost in units of device reliability and sums the total reliability over all devices (i.e., d=1 ... v) over all time steps (i.e., k=1 ... n) of the optimization period. The weights $w_{d,k}$ can be set to prioritize the reliability of some devices over others (e.g., based on whether the device is critical to the operation of the system, based on the relative costs of replacing or repairing the devices, etc.) and/or to prioritize reliability at certain times of day over other times of day (e.g., prioritize reliability during business hours or when the building is occupied). In some embodiments, the weights $w_{d,k}$ are provided as inputs to the cost function J(x), whereas the reliability variables $x_{reliability_{d,k}}$ are decision variables in the cost function J(x).

In some embodiments, the reliability $x_{reliability_{d,k}}$ of a given device is a function of control decisions for the device, its degradation state, and/or an amount of time that has elapsed since the device was put into service or the most recent time at which maintenance was conducted on the device. Reliability $x_{reliability_{d,k}}$ can be quantified and/or predicted using any of a variety of reliability models. Several examples of models that can be used to quantify reliability $x_{reliability_{d,k}}$ and predict reliability values into the future are described in U.S. patent application Ser. No. 15/895,836 filed Feb. 13, 2018, U.S. patent application Ser. No. 16/418,686 filed May 21, 2019, U.S. patent application Ser. No. 16/438,961 filed Jun. 12, 2019, U.S. patent application Ser. No. 16/449,198 filed Jun. 21, 2019, U.S. patent application Ser. No. 16/457,314 filed Jun. 28, 2019, U.S. patent application Ser. No. 16/697,099 filed Nov. 26, 2019, U.S. patent application Ser. No. 16/687,571 filed Nov. 18, 2019, U.S. patent application Ser. No. 16/518,548 filed Jul. 22, 2019, U.S. patent application Ser. No. 16/899,220 filed Jun. 11, 2020, U.S. patent application Ser. No. 16/943,781 filed Jul. 30, 2020, and/or U.S. patent application Ser. No. 17/017,028 filed Sep. 10, 2020. The entire disclosures of each of these patent applications are incorporated by reference herein.

Although several examples of the cost function J(x) are provided, it should be appreciated that these are merely examples of potential cost functions that could be used and should not be regarded as limiting. Additionally, it is contemplated that the cost function J(x) may include multiple terms that account for multiple different control objectives within a single cost function. For example, the monetary cost function and carbon emissions cost function shown above can be combined to generate a single cost function J(x) that accounts for both monetary cost and carbon emissions such as:

$$J(x) = w_1 \sum_{r=1}^{p} \sum_{k=1}^{n} c_{r,k} * x_{r,k} + w_2 \sum_{r=1}^{p} \sum_{k=1}^{n} \beta_{r,k} * x_{r,k}$$

where $w_1$ and $w_2$ are weights that are used to assign the relative importance of the monetary cost defined by the first term and the carbon emissions cost defined by the second term in the overall cost function J(x) and the remaining variables are the same as described with reference to the monetary cost function and carbon emissions cost function above. It is contemplated that any of the cost functions J(x) described throughout the present disclosure can be combined (e.g., by adding them together in a weighted summation and/or subtracting one or more cost functions from one or more other cost functions) to account for any combination of control objectives within a single cost function. In addition to assigning relative importance to various control objectives, the weights $w_1$ and $w_2$ may function as unit conversion factors (e.g., cost per dollar, cost per unit of carbon emissions, etc.) to translate different units associated with different control objectives into a common "cost" unit that is optimized when performing the optimization process.

Asset allocator 302 is also shown to include a high-level optimizer 504. Methods and techniques of high-level optimization which can be performed by high-level optimizer 504 are described in greater detail in U.S. patent application Ser. No. 15/473,496 filed Mar. 29, 2017, the entire disclosure of which is incorporated by reference herein. In general, high-level optimizer 504 performs an optimization of the cost function J(x) transmitted to high-level optimizer 504 from cost function generator 502 subject to a set of constraints to generate an optimization result. In some embodiments, the set of constraints used by high-level optimizer 504 to generate an optimization result is defined by a required load value determine from load/rate predictions transmitted to high-level optimizer 504 from load/rate predictor 422. In other embodiments, the set of constraints used by high-level optimizer 504 to generate an optimization result is defined by incentive predictions transmitted to high-level optimizer 504 from inventive estimator 420.

In some embodiments, high-level optimizer 504 is configured to perform an optimization process using the cost function J(x) to drive the cost defined by the cost function J(x) toward an optimal value (e.g., a minimum or maximum value) subject to a set of constraints. The set of constraints may include equations and/or inequalities that define relationships between variables used in the optimization process. Some of the variables that appear in the set of constraints may be provided as inputs to the optimization process and may be maintained at fixed values when performing the optimization process. Other variables that appear in the set of constraints may have time-varying values and thus may be set to different predetermined values at different time steps k. For example, the time-varying predicted loads $\hat{\ell}_k$ to be served at each time step k may be determined prior to performing the optimization process (e.g., by load/rate predictor 422) and may have different values at different time steps k. The values of such variables may be set to the predetermined values for each time step k during the optimization process.

Some constraints may be separate from the cost function J(x) and define relationships that must be satisfied when performing the optimization process. Such constraints are referred to herein as "hard constraints" because they cannot be violated and impose hard limits on the optimization process. An example of a hard constraint is a load satisfaction constraint that requires the total amount of a particular resource purchased from sources 310, produced by subplants 320, and/or discharged from storage 330 to be greater than or equal to the total amount of that resource delivered to sinks 340 consumed by subplants 320 and stored into storage 330 at a given time step k. Such a constraint may be provided as an inequality within the set of constraints, separate from the cost function J(x).

Other constraints may be formulated as penalties on the value defined by the cost function J(x) and may be included within the cost function J(x) itself. For example, the cost function J(x) can be modified to include a penalty term (e.g., $\Sigma_{k=1}^{n} p_k \delta_k$) that can be added to the base cost function J(x) to define an additional penalty cost within the cost function itself. In this example, the variable $\delta_k$ represents an amount by which a constrained variable deviates from a specified value or range (i.e., an amount by which the constraint is violated) and the variable $p_k$ is the penalty per unit of the deviation. Such constraints are referred to herein as "soft constraints" because they can be violated but will incur a penalty when such violation occurs. As such, high-level optimizer 504 will seek to avoid violating the soft constraints when performing the optimization when the penalty for violating the soft constraints (i.e., the added cost) does not outweigh the benefits (i.e., any reduction to the cost that occurs as a result of violating the soft constraints). The value of the variable $p_k$ can be set to a high value to ensure that the soft constraints are not violated unless necessary to achieve a feasible optimization result.

Any variable that is used to define a constraint on the optimization process performed by high-level optimizer 504 is referred to herein as a "constraint variable," regardless of whether the constraint is implemented as a hard constraint or a soft constraint. Accordingly, constraint variables may include variables that appear in hard constraints separate from the cost function J(x) and/or variables that appear within soft constraints within the cost function J(x) itself. In some embodiments, the constraint variables do not include the decision variables (e.g., the x variables) that are adjusted when performing the optimization process, but rather are limited to the variables that have predetermined values provided as inputs to the optimization process. The predetermined values of some constraint variables may apply to each and every time step of the optimization period (i.e., the same value for each time step), whereas the predetermined values of other constraint variables may be specific to corresponding time steps (i.e., a time series of values for a given constraint variable). For example, the constraint variables may include the required load variables received from load/rate predictor 422 and/or incentive predictions received from incentive estimator 420. In some embodiments, the constraint variables include one or more of the decision variables (e.g., the x variables) within the hard constraints or the soft constraints.

As noted above, the constraint variables may include required load variables that define the amount of each of the resources (e.g., chilled water, hot water, electricity, etc.) required by sinks 340 at each time step k and may have different values at different time steps. For example, the constraint variables may include a time series of required chilled water load values $\hat{\ell}_{cw}$, a time series of hot water load values $\hat{\ell}_{hw}$, and/or a time series of electric load values $\hat{\ell}_{elec}$. Each of these time series may include a required load value for each time step k of the optimization period (i.e., k=1 . . . n) as shown in the following equations:

$\hat{\ell}_{cw} = [\hat{\ell}_{cw,1} \hat{\ell}_{cw,2} \ldots \hat{\ell}_{cw,n}]$ $\hat{\ell}_{hw} = [\hat{\ell}_{hw,1} \hat{\ell}_{hw,2} \ldots \hat{\ell}_{hw,n}]$ $\hat{\ell}_{elec} = [\hat{\ell}_{elec,1} \hat{\ell}_{elec,2} \ldots \hat{\ell}_{elec,n}]$ where n is the total number of time steps and each time series is represented as a vector or array of time step-specific values of the required load variables. In some embodiments, each of the time step-specific values of the required load variables are treated as separate constraint variables by high-level optimizer 504. In some embodiments, one or more of the time series of the required load variables is treated as a single constraint variable that represents each of the time step-specific values within the time series. Any adjustments to such a constraint variable that represents a time series as a whole may include adjustments (e.g., equivalent, proportional, etc.) to each of the time step-specific values that form the time series.

In some embodiments, each of the required loads is associated with a corresponding set of curtailment actions that can be performed by sinks 340 to reduce the required loads. For example, the chilled water load $\hat{\ell}_{cw}$ can be curtailed by increasing chilled water temperature setpoints or reducing flow rate setpoints for equipment within sinks 340 that consume the chilled water (e.g., air handling units, cooling coils, etc.). Similarly, the hot water load $\hat{\ell}_{hw}$ can be curtailed by decreasing hot water temperature setpoints or by reducing flow rate setpoints for equipment within sinks 340 that consume the hot water (e.g., air handling units, heating coils, hot water lines within sinks or kitchens, etc.). The electric load $\hat{\ell}_{elec}$ can be curtailed by operating equipment within sinks 340 to reduce the amount of electricity consumption (e.g., switching off lights, reducing fan speed, operating electricity consuming equipment in a reduced power mode, etc.).

In some embodiments, the constraint variables include a time series of required load values for a refrigeration load $\hat{\ell}_{ref}$. The refrigeration load $\hat{\ell}_{ref}$ may be a specific type of electric load that represents the electricity consumption of refrigeration equipment within sinks 340 (e.g., refrigerators, freezers, coolers, or other refrigeration equipment within a building). In various embodiments, the refrigeration load $\hat{\ell}_{ref}$ may be a subset of the electric load $\hat{\ell}_{elec}$ or may be defined as a separate type of load such that the electric load $\hat{\ell}_{elec}$ excludes any refrigeration loads captured by the refrigeration load $\hat{\ell}_{ref}$. As with the other types of required loads, the refrigeration load $\hat{\ell}_{ref}$ may include a time series of required load values for each time step k of the optimization period as shown in the following equation:

$\hat{\ell}_{ref} = [\hat{\ell}_{ref,1} \hat{\ell}_{ref,2} \ldots \hat{\ell}_{ref,n}]$ where n is the total number of time steps and the time series is represented as a vector or array of time step-specific values of refrigeration load $\hat{\ell}_{ref}$.

It is contemplated that any type or subset of required load (e.g., chilled water load, hot water load, electric load, etc.) can be represented using separate constraint variables to the extent that the required load is independently controllable or curtailable apart from the other required loads. For example, certain plug loads (e.g., electric loads at a specific plug or electric circuit) can be represented using separate constraint variables if those plug loads can be independently curtailed or reduced by performing specific curtailment actions for the corresponding equipment without requiring that those same curtailment actions be performed for other equipment represented by other required loads.

Additionally, it is contemplated that the required loads can be separated into various categories such that each required load represents the resource consumption of the corresponding category to provide high-level optimizer 504 with different constraint variables for each category of required loads. Categories can include, for example, building subsystem or type of equipment (e.g., HVAC, lighting, electrical, communications, security, elevators/lifts, etc.), building (e.g., building A, building B, etc.), room or zone within a building (e.g., floor A, floor B, conference room C, office D, zone E, etc.) importance or criticality of the corresponding space or equipment (e.g., prioritizing critical processes or spaces), or any other category. Advantageously, providing different constraint variables for different categories of required loads may allow high-level optimizer 504 to recommend certain curtailment actions that are specific to a category of required loads without modifying other categories of required loads, or recommending different curtailment actions for the other categories of required loads.

In some embodiments, the constraint variables include performance variables that represent the desired performance level or run rate of a system or process that consumes one or more of the resources modeled by high-level optimizer 504. The system or process can include any of a variety of controllable systems or processes including, for example, an HVAC system that provides heating or cooling to a building, an assembly line in a factory that produces a product or material, a chemical manufacturing process, a cloud computing system that consumes electricity to provide various levels of computing power, or any other system or process that can be run at various speeds, levels, or rates. The performance variables may include discrete performance levels (e.g., high, medium, low, fast mode, slow mode, etc.) or continuous performance levels to define a desired operating point within a range or spectrum (e.g., 25% of maximum capacity, 80% of maximum capacity, etc.). In this scenario, the set of constraints considered by high-level optimizer 504 may include constraints that map each of the performance variables to a corresponding amount of resource consumption for each of the resources consumed by the system or process. For example, for a system or process that consumes chilled water, hot water, and electricity, the constraints may include:

$$p=[p_1 p_2 \ldots p_n]$$

$$\hat{\ell}_{cw,k} = r_{cw} * p_k$$

$$\hat{\ell} = r_{hw} * p_k$$

$$\hat{\ell}_{elec,k} = r_{elec} * p_k$$

where p is a time series or vector/array of performance variables that represent the desired performance level at each time step k=1 . . . n of the optimization period, $p_k$ is the desired performance level at time step k, $r_{cw}$ is a conversion factor that translates the performance level $p_k$ into a corresponding amount of chilled water consumption, $r_{hw}$ is a conversion factor that translates the performance level $p_k$ into a corresponding amount of hot water consumption, and $r_{elec}$ is a conversion factor that translates the performance level $p_k$ into a corresponding amount of electricity consumption. In this example, each of the chilled water load, the hot water load, and the electric load is a function of the performance level. Accordingly, reducing the performance level of the system or process would effectively reduce each of the chilled water load, the hot water load, and the electric load.

In some embodiments, the constraint variables include variables that represent enhanced ventilation requirements. Enhanced ventilation requirements may be represented as a type of performance variable as described above that has discrete levels (e.g., enhanced ventilation on, enhanced ventilation off) or continuous ventilation levels that can be selected from or set to any value within a range or spectrum of ventilation levels. For a ventilation system that consumes only electricity (e.g., to operate one or more fans), the constraints may include:

$$v=[v_1 v_2 \ldots v_n]$$

$$\hat{\ell}_{elec,vent,k} = r_{elec} * v_k$$

where v is a time series or vector/array of desired ventilation levels at each time step k=1 . . . n of the optimization period, $v_k$ is the desired ventilation level at time step k, and $r_{elec}$ is a conversion factor that translates the ventilation level $v_k$ into a corresponding amount of electricity $\hat{\ell}_{elec,vent,k}$ consumed by the ventilation system. In this example, the electricity consumption of the ventilation system is a function of the ventilation level. Accordingly, reducing the ventilation level $v_k$ would result in a corresponding reduction in the electricity consumption $\hat{\ell}_{elec,vent,k}$.

In some embodiments, high-level optimizer 504 is configured to generate at least one dual variable as a result of an optimization process. High-level optimizer 504 may generate the dual variables by calculating the partial derivative of the cost function J(x) with respect to each constraint variable at the optimal operating point defined by the first optimization result. As such, the dual variable represents a gradient of the cost function with respect to a particular constraint variable.

Still referring to FIG. 5, asset allocator 302 is also shown to include constraint modifier 506. As will be described in greater detail below, constraint modifier 506 may be configured to determine a gradient of the cost with respect to each of the constraint variables, recommend changes to one or more of the constraint variables, and modify one or more of the constraint variables based on changes to one or more of the constraint variables to produce modified constraint variables. In general, constraint modifier 506 may be configured to analyze a first optimization result transmitted to constraint modifier 506 from high-level optimizer 506 and generate various recommended changes to the constraint variables. In some embodiments, the some or all of the recommended changes may be generated for use in a second optimization by high-level optimizer 504 in order to generate a second optimization result of lower cost and/or reduced required load. In some embodiments, constraint modifier 506 presents the gradient of the cost with respect to each of the constraint variables and/or the recommended changes to a user (e.g., via user device 516) for selection, by the user, of one or more of the recommended changes. In such embodiments, the constraint modifier modifies one or more of the constraint variables based on the user selection of one or more recommended changes to one or more of the constraint variables.

In some embodiments, constraint modifier 506 is configured to determine a gradient threshold value using one or more user-selected recommended changes and the gradient of the cost associated therewith. In some embodiments, the gradient threshold value defines a gradient value by which constraint modifier 506 automatically (e.g., without user selection) selects, for a future optimization process, one or more recommended changes. For example, a first gradient of the cost for a first subplant to produce an amount of a first resource is $5/ton, a second gradient of the cost for a second subplant to produce an amount of a second resource is $10/ton, and a third gradient of the cost for a third subplant to produce a third resource is $15/ton. Based on a user selection of the corresponding subplants to produce a greater amount of the first resource and the second resource but not the third resource, constraint modifier 506 determines that a maximum gradient threshold value by which it may automatically select increased changes (e.g., changes which increase an amount of a resource produced) is $10/ton. As such, for future optimization processes, constraint modifier 506 may automatically select increased changes with gradients that are substantially equal to or less than $10/ton.

In another example, a first gradient of the cost for a first subplant to produce an amount of a first resource is $60/ton, a second gradient of the cost for a second subplant to produce an amount of a second resource is $50/ton, and a third gradient of the cost for a third subplant to produce a third resource is $25/ton. Based on a user selection of the corresponding subplants to produce a decreased amount of the first resource and the second resource but not the third resource, constraint modifier 506 determines that a minimum gradient threshold value by which it may automatically select decreased changes (e.g., changes which decrease an amount of a resource produced) is $25/ton. As such, for future optimization processes, constraint modifier 506 may automatically select changes with gradients that are substantially equal to or greater than $25/ton. It should be understood that the previous examples are intended not intended to be limiting. The parameters, such as number of user-selected changes and corresponding gradients, number of optimization processes, number of subplants, etc., by which constraint modifier 506 may determine gradient threshold values may be configurable based on user preference. For example, a user may desire that constraint modifier 506 must receive 100 user-selected changes and use the 100 received user-selected changes to determine a gradient threshold value (thus, potentially increasing the accuracy of the determined gradient threshold value with respect to the 100 received user-selected changes).

In some embodiments, high-level optimizer 504 is configured to receive an updated set of constraint variables from constraint modifier 506 included in asset allocator 302. High-level optimizer 504 may be configured to perform a second optimization of the cost function J(x) subject to the updated set of constraint variables to generate a second optimization result that achieves the load and/or cost curtailment selected for the updated set of constraint variables. Further, in some embodiments, the high-level optimizer 504 is configured to transmit the second optimization result to low-level optimizer 434 and/or a cost estimator 508.

In some embodiments, low-level optimizer 434 uses the second optimization result to generate control actions in order to operate building equipment (e.g., subplants 320) according to the second optimization result. Such control actions may indicate an amount of load curtailment (e.g., load reduction). In some embodiments, the second optimization result is transmitted to building management system 406 for curtailment of resources usage due to the reduction of required load. For example, the second optimization result may determine that curtailing a required load may involve a reducing a chilled water load. As a result, a chiller subplant may implement this curtailment requirement by raising the set point temperature of the chilled water produced by the chiller subplant. In some embodiments, building management system 406 stores a list of predefined curtailment actions to perform based on an indicated amount of load curtailment received from central plant controller 400. In some embodiments, the amount of load curtailment is transmitted form a user device (e.g., a mobile phone, a terminal, a control panel) to building management system 406. Such curtailment actions may be used by building management system 406 to determine control signals for various building equipment to perform such curtailment actions. Examples of such curtailment actions may include, but are not limited to, raising all temperature setpoints by 1° F. based on a 1000 ton load curtailment, halting a dehumidification process and raising all temperature setpoints by 1° F. based on a 2000 ton load curtailment, halting a dehumidification process and raising all temperature setpoints by 2° F. based on a 3000 ton load curtailment, and halting all cooling loads generated by various building equipment based on a 4000 ton load curtailment. In some embodiments in which load curtailments are generated for both airside systems (e.g., airside system 130) and waterside systems (e.g., waterside system 120), similar curtailment actions are generated for both the airside system equipment and the waterside system equipment. For example, assume a 1000 ton load curtailment was received for both the waterside system 120 and the airside system 130. Accordingly, all temperature setpoints, for both waterside system 120 and airside system 130, are raised by 1° F.

In another example, the load curtailment may involve reducing a hot water load. As a result, a hot water subplant may implement this curtailment requirement by lowering the setpoint temperature of the hot water produced by the hot water subplant. Additionally, the load curtailment may involve reducing an electrical load used by the building. As a result, the building (e.g., via building management system 406 may implement this curtailment requirement by reducing the lighting resources consumed by the building (e.g., turning off on or more lights, dimming one or more lights, etc.).

In some embodiments, asset allocator 302 may include a cost estimator 508 configured to calculate a predicted cost savings value based on modified constraints used to perform a second optimization. Cost estimator 508 may be configured to receive the first optimization result and the second optimization result (performed using one or more modified constraints) from high-level optimizer 504. The cost estimator 508 may calculate a predicted cost savings value by subtracting the second optimization result from the first optimization result using the equation below:

$$\Delta C = C_1 - C_2$$

where $\Delta C$ represents cost savings in desired units (e.g., dollars, carbon emissions, disease transmission risk, occupant comfort, equipment reliability, etc.), $C_1$ is the first predicted cost of the first optimization result using the initial constraint variables, and $C_2$ is the second predicted cost of the second optimization result using the modified constraint variables. In some embodiments, the predicted cost savings value may be transmitted to user device 516 via communications interface 436 for viewing by a user. In other embodiments, the predicted cost savings value may be stored in memory 410 for use by central plant controller 400. For example, the predicted cost savings value may be stored in memory 410 for use in data analysis (e.g., trend in cost savings over a predetermined time period, summation of cost savings over a predetermined time period, etc.).

The costs $C_1$ and $C_2$ estimated by cost estimator 508 are not limited to monetary cost, but rather can be represented in any unit to account for a variety of different control objectives (e.g., monetary cost, carbon emissions, disease transmission risk, occupant comfort, equipment reliability, etc.). Similarly, the predicted cost savings $\Delta C$ can be expressed in any of the units corresponding to the various different types of cost that can be modeled using the cost function J(x). For cost functions J(x) that account for multiple different control objectives, the predicted cost savings $\Delta C$ can be provided for each of the control objectives (e.g., $\Delta C_{monetary}$, $\Delta C_{carbon\_emissions}$, $\Delta C_{disease\_transmission\_risk}$, $\Delta C_{comfort}$, $\Delta C_{reliability}$, etc.).

Cost estimator 508 may be configured to provide the cost savings $\Delta C$ along with the corresponding change in the value of the constraint variable (e.g., the change in chilled water load $\Delta \hat{\ell}_{cw}$, the change in hot water load $\Delta \hat{\ell}_{hw}$, the change in electric load $\Delta \hat{\ell}_{elec}$, the change in the performance variable $\Delta p$, the change in the ventilation rate $\Delta v$, etc.) between the first optimization and the second optimization. Cost estimator 508 can provide such information in the form of a recommendation that is customized to the particular constraint variable and control objective. Examples of recommendations that can be provided by cost estimator 508 include:

If you reduce your chilled water load by $\Delta \hat{\ell}_{cw}$, you could save $\Delta C_{monetary}$ dollars.

If you reduce your hot water load by $\Delta \hat{\ell}_{hw}$, you could reduce carbon emissions by $\Delta C_{carbon\_emissions}$ tons.

If you increase ventilation rate by $\Delta v$, you could reduce disease transmission risk by $\Delta C_{disease\_transmission\_risk}$ percent but would increase cost by $\Delta C_{monetary}$ dollars.

If you reduce your electric load by $\Delta \hat{\ell}_{elec}$, you could save $\Delta C_{monetary}$ dollars but would reduce occupant comfort by $\Delta C_{comfort}$ percent.

If you reduce your chilled water load by $\Delta \hat{\ell}_{cw}$, you could increase extend equipment life by $\Delta C_{reliability}$ months.

where the values of $\Delta \hat{\ell}_{cw}$, $\Delta \hat{\ell}_{hw}$, $\Delta \hat{\ell}_{elec}$, and $\Delta v$ are the numerical values calculated of the change in the corresponding constraint variable and $\Delta C_{monetary}$, $\Delta C_{carbon\_emissions}$, $\Delta C_{disease\_transmission\_risk}$, $\Delta C_{comfort}$, and $\Delta C_{reliability}$ are the numerical values of the corresponding change in the value of the cost function J(x) or portion of the cost function (x) that accounts for the corresponding control objective.

In some embodiments, cost estimator 508 provides the cost savings $\Delta C$ as a rate that corresponds to the gradient of the cost function J(x) with respect to the corresponding constraint variable. In this embodiment, the cost savings $\Delta C$ is not a difference between two optimization results, but rather is a gradient or rate at which the cost savings $\Delta C$ changes per unit change of the corresponding constraint variable at the point defined by the first optimization result. Cost estimator 508 can provide such information in the form of a recommendation that is customized to the particular constraint variable and control objective. Examples of recommendations that can be provided by cost estimator 508 include:

- If you reduce your chilled water load, you could save $\Delta C_{monetary}$ dollars per kW.
- If you reduce your hot water load, you could reduce carbon emissions by $\Delta C_{carbon\_emissions}$ per kW.
- If you increase ventilation rate, you could reduce disease transmission risk by $\Delta C_{disease\_transmission\_risk}$ percent per CFM, but would increase cost by $\Delta C_{monetary}$ per CFM.
- If you reduce your electric load, you could save $\Delta C_{monetary}$ dollars per kW but would reduce occupant comfort by $\Delta C_{comfort}$ percent per kW.
- If you reduce your chilled water load, you could increase extend equipment life by $\Delta C_{reliability}$ months per kW.

where the values of $\Delta C_{monetary}$, $\Delta C_{carbon\_emissions}$, $\Delta C_{disease\_transmission\_risk}$, $\Delta C_{comfort}$, and $\Delta C_{reliability}$ are the numerical values indicating the gradient or rate at which the value of the cost function J(x) (or control objective-specific portion of the cost function) changes per unit change in the corresponding constraint variable (e.g., $/kW, tons of carbon/kW, percent disease transmission risk per CFM of ventilation rate, etc.).

Constraint Modifier Components

Figure 6:
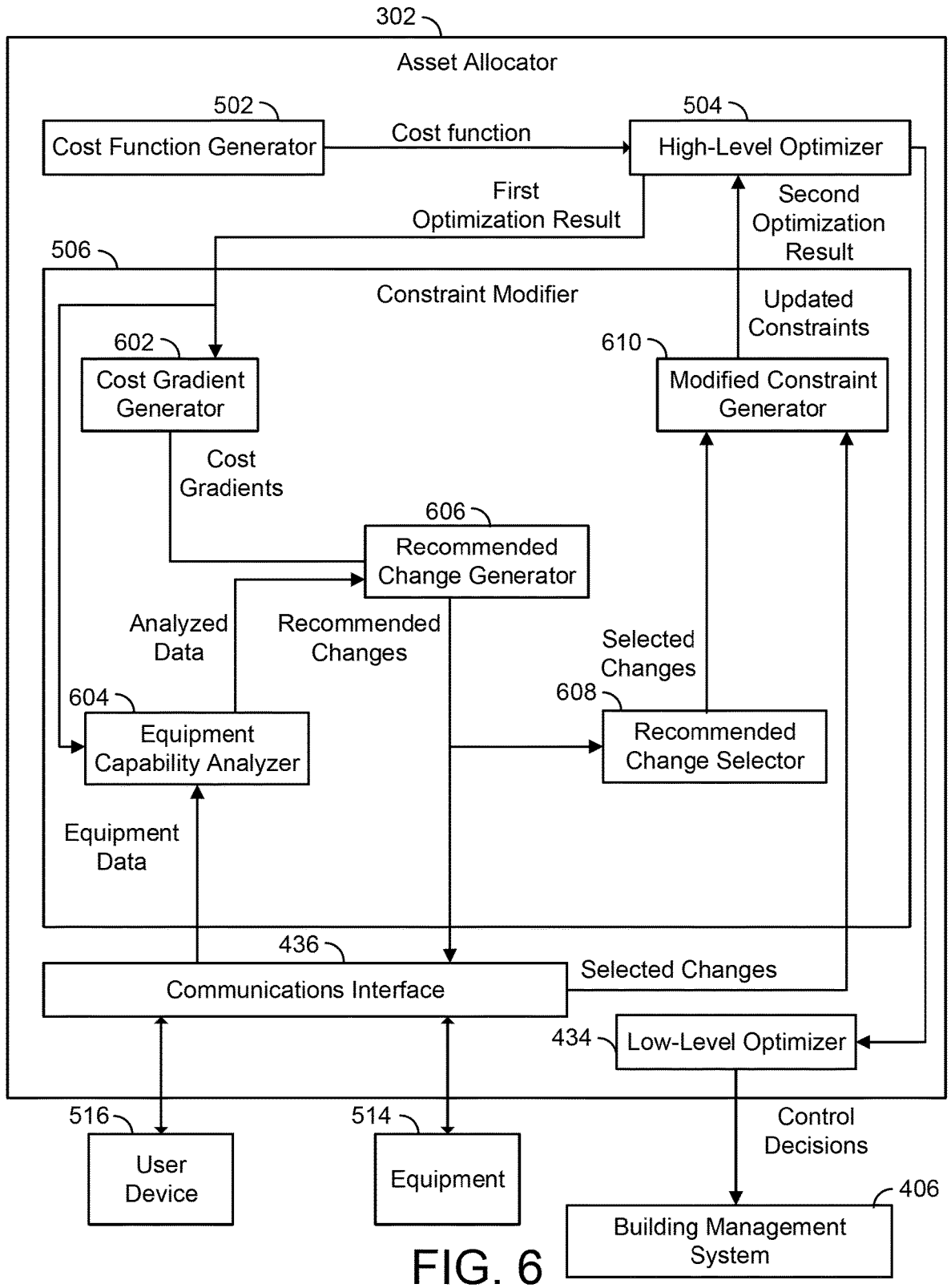
FIG. 6 is a block diagram of the constraint modifier included in the asset allocator of FIG. 5, according to an exemplary embodiment.

Referring now to FIG. 6, a detailed view of the components included in constraint modifier 506 as implemented in asset allocator 302 are shown, according to an exemplary embodiment. Constraint modifier 506 is shown to include a cost gradient generator 602 configured to generate a gradient of the cost with respect to a particular constraint variable, according to an exemplary embodiment. More specifically, in such embodiments, cost gradient generator generates a gradient of the cost function with respect a particular constraint variable at a particular operating point defined by the first operating point. In some embodiments, a gradient of the cost is a ratio of the change in cost as determined by the cost function with respect to a particular constraint variable to a change in a value defined by the constraint variable. In some embodiments, the gradient of the cost is a derivative (e.g., a slope) of the cost function with respect to the particular constraint variable. In some embodiments, the gradient of the cost is represented by the dual variable generated by high-level optimizer 504 in an optimization process. As used herein, the terms "cost gradient," "gradient of the cost," and "dual variable" are intended to be equal.

Constraint modifier 506 is shown to include an equipment capability analyzer 604 configured to analyze data of the one or more pieces of equipment 514 (included in central plant 200), according to an exemplary embodiment. Equipment capability analyzer 604 may communicate with equipment 514 to receive data relating to the capability of one or more pieces of equipment (e.g., pieces of equipment included in subplants 320) to produce a predetermined amount of a particular resource based on the first optimization result. In some embodiments, equipment capability analyzer 504 may retrieve the maximum amount of a corresponding resource (e.g., tons of chilled water, etc.) that can be produced by equipment 514. For example, equipment capability analyzer 604 may look at the required load based on a first optimization result and compare it to the ability of one or more pieces of equipment to produce the required amount. In some embodiments, equipment capability analyzer 604 may determine that one or more pieces of equipment may not be capable of producing the amount of a particular resource as define by the required load. Equipment capability analyzer 604 may output the analyzed equipment data to recommended change generator 606.

Still referring to FIG. 6, constraint modifier 506 is shown to include a recommended change generator 606 configured to generate one or more recommended changes to one or more constraint variables for use in a second optimization process, according to an exemplary embodiment. In some embodiments, recommended change generator 606 generates one or more recommended changes to one or more constraint variables based on one or more cost gradients transmitted by cost gradient generator 602 and/or analyzed equipment data transmitted by equipment capability analyzer 604. Recommended change generator 606 may output one or more recommended changes to a recommended change selector 608 or a user device 516 (via communications interface 436) for selection of the one or more recommended changes.

In some embodiments, recommended change generator 606 recommends changes to one or more constraint variables based on the ability for equipment 514 to produce an amount of one or more resources required by the building. In some embodiments, recommended change generator 606 uses analyzed data transmitted by equipment capability analyzer 604 to determine if equipment 514 is capable of generating the required amount of a particular resource as defined by the required load of the first optimization. In some embodiments in which equipment 514 is not capable of producing the required amount of a particular resource, recommended change generator 606 may determine an amount of load curtailment required in order to reduce the required load to an amount capable of production by equipment 514 by subtracting the maximum amount of resource production from the required load. For example, recommended change generator 606 may recommend reducing the amount of required load to be less than or equal to the maximum amount of the corresponding resource that can be produced at a particular time.

In some embodiments, recommended change generator 606 generates recommended changes based on the gradient of the cost with respect to each of the constraint variables. In some embodiments, recommended change generator 606 recommends changes to one or more constraint variables with a determined cost gradient that is higher than a predetermined threshold value. For example, if the cost gradient to produce a required amount of chilled water is greater than a predetermined threshold value, then recommended change generator 606 may recommend a reduction in the one or more constraints that represent the amount of chilled water. In other embodiments, recommended change generator 606 recommends changes to one or more constraint variables with a determined cost gradient that is lower than a predetermined threshold value. For example, if the cost gradient to produce a required amount of chilled water is less than a predetermined threshold value, then recommended change generator 606 may recommend an increase in the one or more constraints that represents the amount of chilled water (e.g., in order to produce more chilled water at a lower cost that may be stored in storage 330 and used at a later time).

In some embodiments, recommended change generator 606 outputs one or more recommended changes to communications interface 436 and/or a recommended change selector 608. The communications interface 436 may communicate with a user via a user device 516 (e.g., a cellular phone, computer, etc.). In some embodiments, a user selects one or more recommended changes to the one or more constraint variables using user device 516. In other embodiments, recommended change selector 608 is configured to select one or more recommended changes to the one or more constraint variables. Further, in other embodiments, recommended change selector 608 selects one or more recommended changes to the one or more constraint variables based on the greatest cost savings and/or largest reduction in load required by the building.

Still referring to FIG. 6, constraint modifier 506 is shown to include modified constraint generator 610 configured to update one or more constraint variables based on selection of one or more recommended changes, according to an exemplary embodiment. In some embodiments, modified constraint generator 610 updates one or more of the constraint variables based on a user selection (e.g., using user device 516) of one or more of the recommended changes generated by recommended change generator 606. In other embodiments, modified constraint generator 610 updates one or more of the constraint variables based on automatic selection of one or more of the recommended changes by recommended change selector 608. Modified constraint generator 610 is shown to output update constraints to high-level optimizer 504 for use in a second optimization process.

In some embodiments, modified constraint generator 610 determines whether a trigger condition has been satisfied for one or more of the constraint variables and updates one or more of the constraint variables in response to determining that the trigger condition is satisfied. Each of the constraint variables may be associated with its own trigger condition or set of trigger conditions that are independently evaluated to determine whether to update the corresponding constraint variable. The trigger condition for a constraint variable may be based on the value of the gradient of the cost function with respect that constraint variable. Accordingly, the trigger condition for a constraint variable may be satisfied or not satisfied depending on the value of the corresponding gradient.

In some embodiments, modified constraint generator 610 evaluates the trigger condition by comparing the value of the gradient to a threshold value (e.g., a minimum value threshold, a maximum value threshold, a threshold range, etc.). Modified constraint generator 610 may determine that the trigger condition for a constraint variable is satisfied if the corresponding gradient exceeds the threshold value or is less than the threshold value, depending on the type of constraint variable and the direction of the proposed change to the constraint variable. For changes to constraint variables that are predicted to move the value of the cost function in a desirable direction (e.g., reduce cost, increase occupant comfort, reduce disease transmission risk, increase equipment reliability, etc.), modified constraint generator 610 may use a minimum value threshold and may determine that the trigger condition is satisfied in response to the gradient exceeding the threshold (e.g., being greater than a positive threshold or less than a negative threshold). In this scenario, a gradient value exceeding the threshold indicates that the constraint variable has a significant impact on the value of the cost function and could be adjusted to move the value of the cost function in a desirable direction (e.g., reducing a required load constraint variable would reduce cost by at least a threshold amount or threshold rate). Conversely, for changes to constraint variables that are predicted to move the value of the cost function in an undesirable direction (e.g., increase cost, decrease occupant comfort, increase disease transmission risk, decrease equipment reliability, etc.), modified constraint generator 610 may use a maximum value threshold and may determine that the trigger condition is satisfied in response to the gradient being less than the threshold (e.g., being less than a positive threshold or greater than a negative threshold). In this scenario, a gradient value of less than the threshold indicates that the constraint variable has a minimal impact on the value of the cost function and could be adjusted without causing significant changes to the value of the cost function in an undesirable direction (e.g., increasing a required load constraint variable would not increase cost by more than a threshold amount or threshold rate).

In some embodiments, modified constraint generator 610 determines whether the trigger condition is satisfied based on user input provided via a user interface. For example, recommended change generator 606 may present the gradients of the cost function with respect to each constraint variable and/or recommended changes to the constraint variables to a user device 516 as described above. Modified constraint generator 610 may receive user input from user device 516 indicating which of the constraint variables and/or recommended changes have been selected by the user. Modified constraint generator 610 may proceed with generating modified values of the constraint variables selected by a user.

Method of Controlling Building Environment

Figure 7:
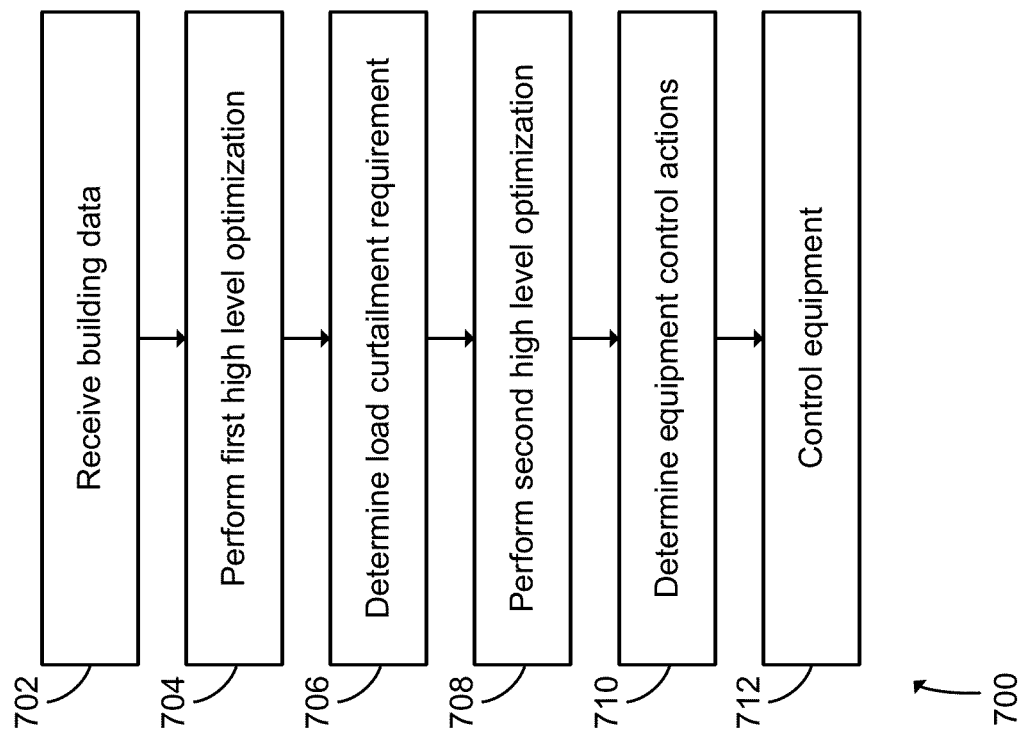
FIG. 7 is a flowchart illustrating a process of controlling a building environment with high-level optimization, according to an exemplary embodiment.

Referring now to FIG. 7, a flowchart of a process 700 for controlling building equipment (e.g., subplants 320) with load curtailment is shown, according to an exemplary embodiment. Process 700 may be performed by one or more components of central plant controller 400. Process 700 is shown to begin with step 702. Step 702 may involve asset allocator 302 receiving building data from various components included in central plant controller 400. In some embodiments, asset allocator 302 receives load and rate predictions from load/rate predictor 422. In other embodiments, asset allocator 302 receives incentive predictions from incentive estimator 420. In some embodiments, the building data received by asset allocator 302 defines the required load by the building in which asset allocator 302 is implemented.

Process 700 is shown to continue with step 704. Step 704 may involve performing a high-level optimization. In some embodiments, as previously discussed, the high-level optimization is executed by asset allocator 302. In some embodiments, step 704 involves performing a first optimization based on a first set of constraint variables defined by the required load received in step 702. In some embodiments, step 704 involves high-level optimizer 504 driving the cost defined by the cost function J(x) to a minimum value subject to a set of constraints. Further, in some embodiments, step 704 involves high-level optimizer 504 generating at least one dual variable by calculating the partial derivative of the cost function J(x) with respect to each constraint variable at the optimal operating point defined by the first optimization result.

Still referring to FIG. 7, process 700 is shown to continue with step 706. At step 706, constraint modifier 506 may determine whether curtailment of required load of the building is required by analyzing the capability for one or more subplants to produce an amount of one or more resources defined by the first optimization result. For example, the demand of resources to be produced by central plant 200 may be too great for the capability of central plant 200. In some embodiments, the loads required by the building may be curtailed in order reduce the required amount of one or more particular resources to an amount achievable by one or more subplants. For example, the required amount of chilled water may be too great for the chilled water subplant (e.g., chiller 322) to produce may be reduced.

In some embodiments, step 706 involves determining whether curtailment of required load of the building by determining that a cost to produce an amount of one or more resources defined by the first optimization result is greater than a predetermined value. As a result, in some embodiments, the loads required by the building are curtailed in order to reduce the cost to produce an amount of one or more resources to a value substantially equal to or less than a predetermined value. In other embodiments, step 706 involves determining that a cost savings is associated with curtailing the load required by the building to produce one or more resources. As will be described in greater detail below with reference to FIG. 8, step 706 may involve modifying the first set of constraint variables used by asset allocator 302 in the first high-level optimization to generate an updated set of constraint variables for use in a second high level optimization performed by asset allocator 302.

Process 700 is shown to continue with step 708. Step 708 may involve high-level optimizer 504 performing a second optimization of the cost function J(x) subject to the second set of constraints determined in step 706. In some embodiments, step 708 may involve high-level optimizer 504 performing a second optimization of the cost function J(x) subject to the updated set of constraint variables to generate a second optimization result that achieves the load and/or cost curtailment selected for the updated set of constraint variables. Further, in some embodiments, step 708 may involve the high-level optimizer 504 transmitting the second optimization result to low-level optimizer 434 and/or a cost estimator 508.

Process 700 is shown to continue with step 710. Step 710 may involve low-level optimizer 434 determining control actions based on a second optimization result generated by asset allocator 302 in step 708. Process 700 is shown conclude with step 712. In some embodiments, step 712 may involve controlling various building equipment using the control actions determined in step 710. In some embodiments, step 712 involves controlling various building equipment to achieve the load curtailment requirements determined in step 706.

High-Level Optimization with Load Curtailment

Figure 8:
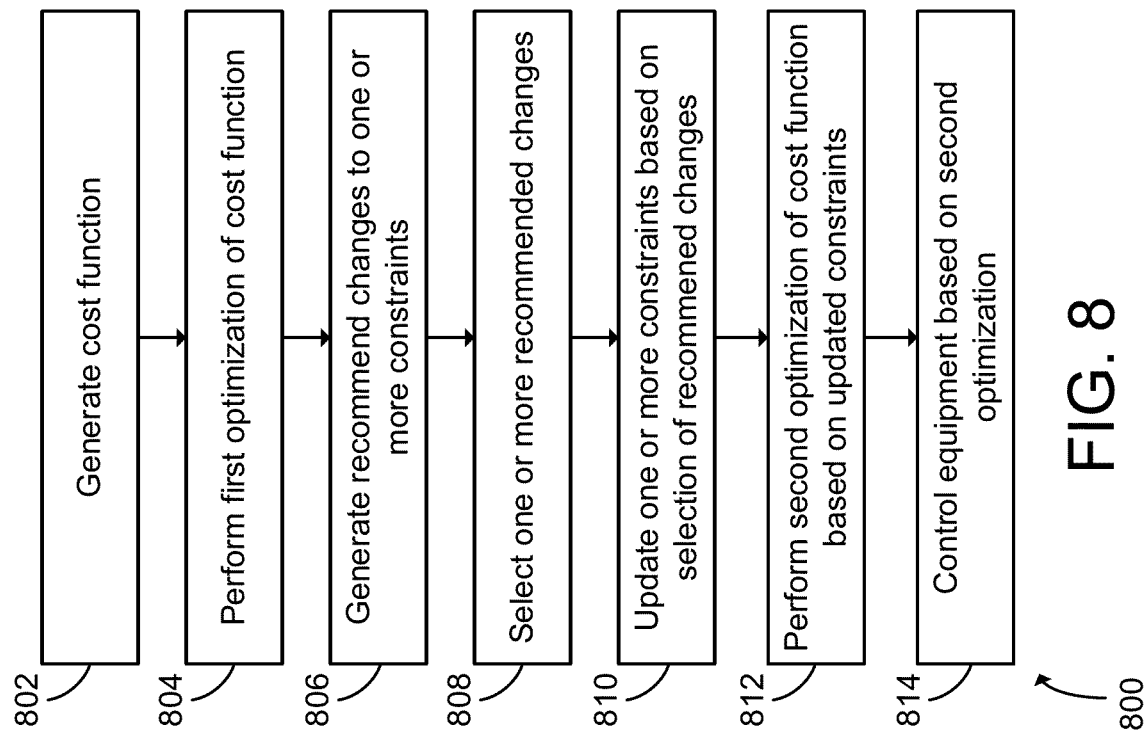
FIG. 8 is a flowchart illustrating a process of controlling a building environment implemented with the asset allocator of FIG. 5, according to an exemplary embodiment.

Referring now to FIG. 8, a process 800 is shown illustrating the process of optimization with curtailment, according to an exemplary embodiment. Process 800 may be implemented for use with asset allocator 302. Process 800 is shown to begin with step 802. Step 802 may involve generating a cost function J(x). In some embodiments, the cost function is generated by cost function generator 502 in step 802. As previously described, generating a cost function J(x) may involve expressing economic cost as a function of the control decisions made by asset allocator 302. Generating the cost function J(x) may involve collecting the cost of resources purchased from sources 310, as well as the revenue generated by selling resources to resource purchasers 341 or energy grid 342 or participating in incentive programs.

Process 800 is shown to proceed with step 804. Step 804 may involve performing a first optimization of the cost function subject to a first set of constraints. In some embodiments, the first set of constraints is defined by a required load value of the building in which process 800 is implemented. In some embodiments, high-level optimizer 504 performs the first optimization in step 804. In some embodiments, the first optimization results in defining a first optimization result. The first optimization result may define the first values of decision variables. In some embodiments, the first values of decision variables may include the amount of resources consumed and/or produced by the subplants included in a central plant (e.g., central plant 200). In some embodiments, the first values of decision variables may be outputted by high-level optimizer 504 to constraint modifier 506 in step 804.

Process 800 is shown to proceed with step 806. Step 806 may involve generating recommended changes to one or more constraints based on the result of the first optimization performed in step 804. In some embodiments, step 806 involves cost gradient generator 602 generating a gradient of the cost with respect to a particular constraint variable. In some embodiments, step 804 involves cost gradient generator 602 generating a gradient of the cost for each of the constraint variables from the dual variables generated by high-level optimizer 504 in the optimization process of step 804. In some embodiments, step 806 involves presenting each generated gradient of the cost to a user (e.g., via user device 516).

Further, in some embodiments, step 806 may involve equipment capability analyzer 604 analyzing data relating to the capability of one or more pieces of equipment (e.g., pieces of equipment included in subplants 320) to produce a predetermined amount of a particular resource based on the first optimization result of step 804. In some embodiments, step 806 may involve equipment capability analyzer 504 retrieving the maximum amount of a corresponding resource (e.g., tons of chilled water, etc.) that can be produced by equipment 514. In some embodiments, step 806 may involve equipment capability analyzer 604 determining that one or more pieces of equipment may not be capable of producing the amount of a particular resource as defined by the first optimization result of step 804.

Still referring to FIG. 8, step 806 may involve recommended change generator 606 generating one or more recommended changes to one or more constraint variables for use in a second optimization process. In some embodiments, step 806 may involve recommended change generator 606 generating one or more recommended changes to one or more constraint variables based on one or more cost gradients transmitted by cost gradient generator 602 and/or analyzed equipment data transmitted by equipment capability analyzer 604. Recommended change generator 606 may output one or more recommended changes to a recommended change selector 608 or a user device 516 (via communications interface 436) in step 806.

Process 800 is shown to continue with step 808. Step 808 may involve selecting one or more of the recommended changes to the one or more constraints generated in step 806. In some embodiments, a user selects one or more recommended changes to the one or more constraint variables using user device 516 in step 808. In such embodiments, a gradient threshold value is determined using one or more user-selected recommended changes and the gradient of the cost associated therewith. Further, in some embodiments, step 808 may involve recommended change selector 608 selecting one or more recommended changes to the one or more constraint variables based the determined gradient threshold value. In some embodiments, step 808 may involve recommended change selector 608 selecting one or more recommended changes to the one or more constraint variables based on the greatest cost savings and/or largest reduction in load required by the building.

In some embodiments, step 808 involves automatically selecting one or more recommended changes to the one or more constraints generated in step 806. In such embodiments, constraint modifier 506 automatically selects the one or more changes based on a minimum gradient threshold value. Such a minimum gradient threshold value defines a minimum gradient value by which the controller selects the one or more changes. As previously described with reference to FIG. 5, the minimum gradient threshold value is a user-defined value that is inputted by a user.

In some embodiments, step 808 involves presenting one or more recommended changes to the one or more constraints generated in step 806. In some embodiments, the user is presented with the cost gradient, the one or more recommended changes, and/or the predicted savings based on selection of the one or more recommended changes. As such, the user selects the one or more recommended changes.

In some embodiments, step 808 involves presenting the gradient of the cost to the user. As such, the user selects one or more changes to the one or more constraints based on the gradient of the cost. In such embodiments, constraint modifier 506 does not recommend changes based on the cost gradient. For example, a user is presented with a gradient of the cost for a subplant to produce an amount of a resource being $5/ton. With this information, the user may select to increase or decrease an amount of the produced resource.

Still referring to FIG. 8, process 800 is shown to proceed with step 810. Step 810 may involve updating one or more constraints based on the selected recommended changes. In some embodiments, step 810 may involve modified constraint generator 610 updating one or more constraint variables based on selection of one or more recommended changes, according to an exemplary embodiment. In some embodiments, step 810 involves modified constraint generator 610 updating one or more of the constraint variables based on a user selection (e.g., using user device 516) of one or more of the recommended changes generated by recommended change generator 606. In other embodiments, step 810 involves modified constraint generator 610 updating one or more of the constraint variables based on automatic selection of one or more of the recommended changes by recommended change selector 608. Step 810 may involve modified constraint generator 610 outputting the updated constraints to high-level optimizer 504 for use in a second optimization process.

Process 800 is shown to continue with step 812. Step 812 may involve performing a second optimization of the cost function J(x) subject to the updated constraints generated in step 810. In some embodiments, step 812 may involve high-level optimizer 504 performing a second optimization of the cost function J(x) subject to the updated set of constraint variables to generate a second optimization result that achieves the load and/or cost curtailment selected for the updated set of constraint variables. Further, in some embodiments, step 810 may involve the high-level optimizer 504 transmitting the second optimization result to low-level optimizer 434 and/or a cost estimator 508.

In some embodiments, step 812 may involve using the second optimization result to generate a predicted cost savings value between the second optimization result and the first optimization result. In some embodiments, cost estimator 508 may be configured to receive the first optimization result and the second optimization result from high-level optimizer 504 in step 812. In step 912, the cost estimator 508 may calculate a predicted cost savings value by subtracting the second optimization result from the first optimization result. In some embodiments, the predicted cost savings value may be transmitted to user device 516 via communications interface 436 for viewing by a user in step 812. In other embodiments, the predicted cost savings value is stored in memory 410 for use by central plant controller 400 in step 812.

Still referring to FIG. 8, Process 800 is shown to conclude with step 814. Step 814 may involve controlling building equipment based on the second optimization. In some embodiments, step 814 involves low-level optimizer 434 using the second optimization result to generate control actions in order to operate building equipment (e.g., subplants 320) according to the second optimization result. In some embodiments, step 814 involves the second optimization result being transmitted to building management system 406 for curtailment of resources usage due to the reduction of required load. For example, the second optimization result may determine that curtailing a required load may involve a reducing a chilled water load. As a result, a chiller subplant may implement this curtailment requirement by raising the set point temperature of the chilled water produced by the chiller subplant.

In another example, the load curtailment may involve reducing a hot water load. As a result, a hot water subplant may implement this curtailment requirement by lowering the setpoint temperature of the hot water produced by the hot water subplant. Additionally, the load curtailment may involve reducing an electrical load used by the building. As a result, the building (e.g., via building management system 406 may implement this curtailment requirement by reducing the lighting resources consumed by the building (e.g., turning off on or more lights, dimming one or more lights, etc.).

CONFIGURATION OF EXEMPLARY EMBODIMENTS

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A controller comprising:
a processing circuit comprising one or more processors and memory storing instructions that, when executed by the one or more processors, cause the one or more processors to perform operations comprising:
determining a gradient of an objective function with respect to a constraint variable defining a constraint on a control process that uses the objective function;
modifying the constraint variable to have a modified value in response to determining that a trigger condition is satisfied, the trigger condition based on a comparison between the gradient and a gradient threshold;
performing the control process subject to the constraint using the modified value of the constraint variable, wherein the constraint variable is maintained at the modified value during the control process; and
operating equipment in accordance with a result of the control process.

2. The controller of claim 1, wherein:
the objective function comprises a carbon emissions control objective indicating an amount of carbon emissions associated with operating the equipment;
the constraint variable defines a required load to be served by the equipment; and
the gradient of the objective function comprises a gradient of the carbon emissions control objective with respect to the required load.

3. The controller of claim 1, wherein:
the objective function comprises a disease transmission risk control objective indicating a risk of disease transmission associated with operating the equipment;
the constraint variable defines a ventilation rate to be achieved by operating the equipment; and
the gradient of the objective function comprises a gradient of the disease transmission risk control objective with respect to the ventilation rate.

4. The controller of claim 1, wherein:
the objective function comprises an occupant comfort control objective indicating occupant comfort associated with operating the equipment;
the constraint variable defines a required load to be served by the equipment; and
the gradient comprises a gradient of the occupant comfort control objective with respect to the required load.

5. The controller of claim 1, wherein:
the objective function comprises a monetary cost control objective indicating a monetary cost of operating the equipment;
the constraint variable defines a required load to be served by the equipment; and
the gradient comprises a gradient of the monetary cost control objective with respect to the required load.

6. The controller of claim 1, wherein:
the objective function comprises a plurality of control objectives; and
the gradient comprises at least one of:
a control objective specific gradient for each of the plurality of control objectives with respect to the constraint variable; or
a gradient of an overall value of the objective function with respect to the constraint variable.

7. The controller of claim 1, wherein performing the control process comprises performing an optimization of the objective function subject to the constraint.

8. The controller of claim 1, wherein determining the gradient of the objective function with respect to the constraint variable comprises:
performing the control process using an initial value of the constraint variable to generate an initial result of the control process; and
determining the gradient of the objective function with respect to the constraint variable at a point defined by the initial result of the control process.

9. The controller of claim 1, wherein determining whether the trigger condition is satisfied comprises
determining that the trigger condition is satisfied if the gradient exceeds the threshold value.

10. The controller of claim 1, wherein determining whether the trigger condition is satisfied comprises:
presenting the gradient to a user; and
determining that the trigger condition is satisfied in response to the user providing a request to modify the constraint variable.

11. A method comprising:
determining a gradient of an objective function with respect to a constraint variable defining a constraint on a control process that uses the objective function;
modifying the constraint variable to have a modified value in response to determining that a trigger condition is satisfied, the trigger condition based on a comparison between the gradient and a gradient threshold;
performing the control process subject to the constraint using the modified value of the constraint variable, wherein the constraint variable is maintained at the modified value during the control process; and operating equipment in accordance with a result of the control process.

12. The method of claim 11, wherein:

the objective function comprises a carbon emissions control objective indicating an amount of carbon emissions associated with operating the equipment;

the constraint variable defines a required load to be served by the equipment; and the gradient of the objective function comprises a gradient of the carbon emissions control objective with respect to the required load.

13. The method of claim 11, wherein:

the objective function comprises a disease transmission risk control objective indicating a risk of disease transmission associated with operating the equipment;

the constraint variable defines a ventilation rate to be achieved by operating the equipment; and the gradient of the objective function comprises a gradient of the disease transmission risk control objective with respect to the ventilation rate.

14. The method of claim 11, wherein:

the objective function comprises an occupant comfort control objective indicating occupant comfort associated with operating the equipment;

the constraint variable defines a required load to be served by the equipment; and the gradient comprises a gradient of the occupant comfort control objective with respect to the required load.

15. The method of claim 11, wherein:

the objective function comprises a monetary cost control objective indicating a monetary cost of operating the equipment;

the constraint variable defines a required load to be served by the equipment; and the gradient comprises a gradient of the monetary cost control objective with respect to the required load.

16. The method of claim 11, wherein:

the objective function comprises a plurality of control objectives; and the gradient comprises at least one of:

a control objective specific gradient for each of the plurality of control objectives with respect to the constraint variable; or a gradient of an overall value of the objective function with respect to the constraint variable.

17. The method of claim 11, wherein determining the gradient of the objective function with respect to the constraint variable comprises:

performing the control process using an initial value of the constraint variable to generate an initial result of the control process; and determining the gradient of the objective function with respect to the constraint variable at a point defined by the initial result of the control process.

18. The method of claim 11, wherein determining whether the trigger condition is satisfied comprises determining that the trigger condition is satisfied if the gradient exceeds the threshold value.

19. The method of claim 11, wherein determining whether the trigger condition is satisfied comprises:

presenting the gradient to a user; and determining that the trigger condition is satisfied in response to the user providing a request to modify the constraint variable.

20. One or more non-transitory computer-readable media storing instructions that, when executed by one or more processors, cause the one or more processors to perform operations comprising:

obtaining an objective function comprising a carbon emissions control objective indicating an amount of carbon emissions predicted to result from operating equipment in accordance with a set of control decisions;

determining a gradient of the objective function with respect to a constraint variable defining a limit on a load to be served by operating the equipment;

curtailing the load to be served by operating the equipment and modifying the constraint variable to have a curtailed load value in response to the gradient exceeding a threshold;

performing a control process subject to the constraint using the curtailed load value to generate the set of control decisions; and operating the equipment in accordance with the set of control decisions.

* * * * *